United States Patent
Richter et al.

(10) Patent No.: US 11,579,988 B2
(45) Date of Patent: *Feb. 14, 2023

(54) REPORTING CONTROL INFORMATION ERRORS

(71) Applicant: Micron Technology, Inc., Boise, ID (US)

(72) Inventors: Michael Dieter Richter, Ottobrunn (DE); Thomas Hein, Munich (DE); Wolfgang Anton Spirkl, Germering (DE); Martin Brox, Munich (DE); Peter Mayer, Neubiberg (DE)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/376,728

(22) Filed: Jul. 15, 2021

(65) Prior Publication Data

US 2022/0004466 A1  Jan. 6, 2022

Related U.S. Application Data

(63) Continuation of application No. 16/719,896, filed on Dec. 18, 2019, now Pat. No. 11,086,733.

(Continued)

(51) Int. Cl.
*G06F 11/07* (2006.01)
*G06F 11/14* (2006.01)

(52) U.S. Cl.
CPC ...... *G06F 11/1469* (2013.01); *G06F 11/0772* (2013.01); *G06F 11/0703* (2013.01);
(Continued)

(58) Field of Classification Search
CPC ............ G06F 11/0766; G06F 11/0772; G06F 11/0757; G06F 11/076
See application file for complete search history.

(56) References Cited

U.S. PATENT DOCUMENTS

| | | |
|---|---|---|
| 8,352,805 B2 | 1/2013 | Shaeffer et al. |
| 8,719,662 B2 | 5/2014 | Eggleston et al. |
| (Continued) | | |

OTHER PUBLICATIONS

European Search Report received for EP Patent Application No. 19901024.0, dated Feb. 24, 2022, 10 pages.

(Continued)

*Primary Examiner* — Jonathan D Gibson
(74) *Attorney, Agent, or Firm* — Holland & Hart LLP

(57) ABSTRACT

Methods, systems, and devices for reporting control information errors are described. A state of a memory array may be monitored during operation. After detecting an error (e.g., in received control information), the memory device may enter a first state (e.g., a locked state) and may indicate to a host device that an error was detected, the state of the memory array before the error was detected, and/or at least a portion of a control signal carrying the received control information. The host device may diagnose a cause of the error based on receiving the indication of the error and/or the copy of the control signal. After identifying and/or resolving the cause of the error, the host device may transmit one or more commands (e.g., unlocking the memory device and returning the memory array to the original state) based on receiving the original state from the memory device.

20 Claims, 10 Drawing Sheets

Related U.S. Application Data

(60) Provisional application No. 62/781,989, filed on Dec. 19, 2018.

(52) U.S. Cl.
CPC ........ *G06F 11/076* (2013.01); *G06F 11/0757* (2013.01); *G06F 2201/82* (2013.01)

(56) References Cited

U.S. PATENT DOCUMENTS

| | | |
|---|---|---|
| 8,732,533 B2 | 5/2014 | Resnick |
| 9,852,811 B2 | 12/2017 | Chang et al. |
| 2007/0277065 A1 | 11/2007 | Sato |
| 2009/0235113 A1 | 9/2009 | Shaeffer et al. |
| 2009/0292945 A1* | 11/2009 | Kano ................ G06F 11/0727 714/E11.113 |
| 2012/0011409 A1 | 1/2012 | Resnick |
| 2014/0258786 A1 | 9/2014 | Resnick |
| 2014/0289398 A1* | 9/2014 | Nakai .................... H04L 41/06 709/224 |
| 2015/0019936 A1 | 1/2015 | Gillingham |
| 2015/0106664 A1* | 4/2015 | McClain ............... G06F 3/0614 714/57 |
| 2015/0378817 A1 | 12/2015 | Tsern et al. |
| 2016/0139983 A1 | 5/2016 | Chang et al. |
| 2016/0224412 A1* | 8/2016 | Healy ................... H03M 13/19 |
| 2017/0075603 A1 | 3/2017 | Trantham |
| 2018/0203759 A1 | 7/2018 | Shaeffer et al. |
| 2020/0201718 A1 | 6/2020 | Richter et al. |

OTHER PUBLICATIONS

ISA/KR, International Search Report and Written Opinion of the International Searching Authority, Int'l Appl. No. PCT/US2019/067412, dated Apr. 23, 2020, Korean Intellectual Property Office, Seo-gu, Daejeon, Republic of Korea, 11 pgs.

* cited by examiner

REPORTING CONTROL INFORMATION ERRORS

CROSS REFERENCE

The present application for patent is a continuation of U.S. Provisional patent application Ser. No. 16/719,896 by Richter et al., entitled "REPORTING CONTROL INFORMATION ERRORS," filed Dec. 18, 2019, which claims priority to U.S. Provisional Patent Application No. 62/781,989 by Richter et al., entitled "REPORTING CONTROL INFORMATION ERRORS," filed Dec. 19, 2018, assigned to the assignee hereof and each of which is expressly incorporated by reference in its entirety.

BACKGROUND

The following relates generally to operating a memory array and more specifically to reporting control information errors.

Memory devices are widely used to store information in various electronic devices such as computers, wireless communication devices, cameras, digital displays, and the like. Information is stored by programing different states of a memory device. For example, binary devices have two states, often denoted by a logic "1" or a logic "0." In other systems, more than two states may be stored. To access the stored information, a component of the electronic device may read, or sense, the stored state in the memory device. To store information, a component of the electronic device may write, or program, the state in the memory device.

Various types of memory devices exist, including magnetic hard disks, random access memory (RAM), read-only memory (ROM), dynamic RAM (DRAM), synchronous dynamic RAM (SDRAM), ferroelectric RAM (FeRAM), magnetic RAM (MRAM), resistive RAM (RRAM), flash memory, phase change memory (PCM), and others. Memory devices may be volatile or non-volatile. Non-volatile memory (e.g., FeRAM, PCM, RRAM) may maintain their stored logic state for extended periods of time even in the absence of an external power source. Volatile memory devices (e.g., DRAM) may lose their stored state over time unless they are periodically refreshed by an external power source.

Control information for operating or accessing a memory device may be communicated between an external controller and a memory device. In some cases, control information received at the memory device is corrupted. Improved techniques for managing such cases are desired.

DETAILED DESCRIPTION

Figure 1:
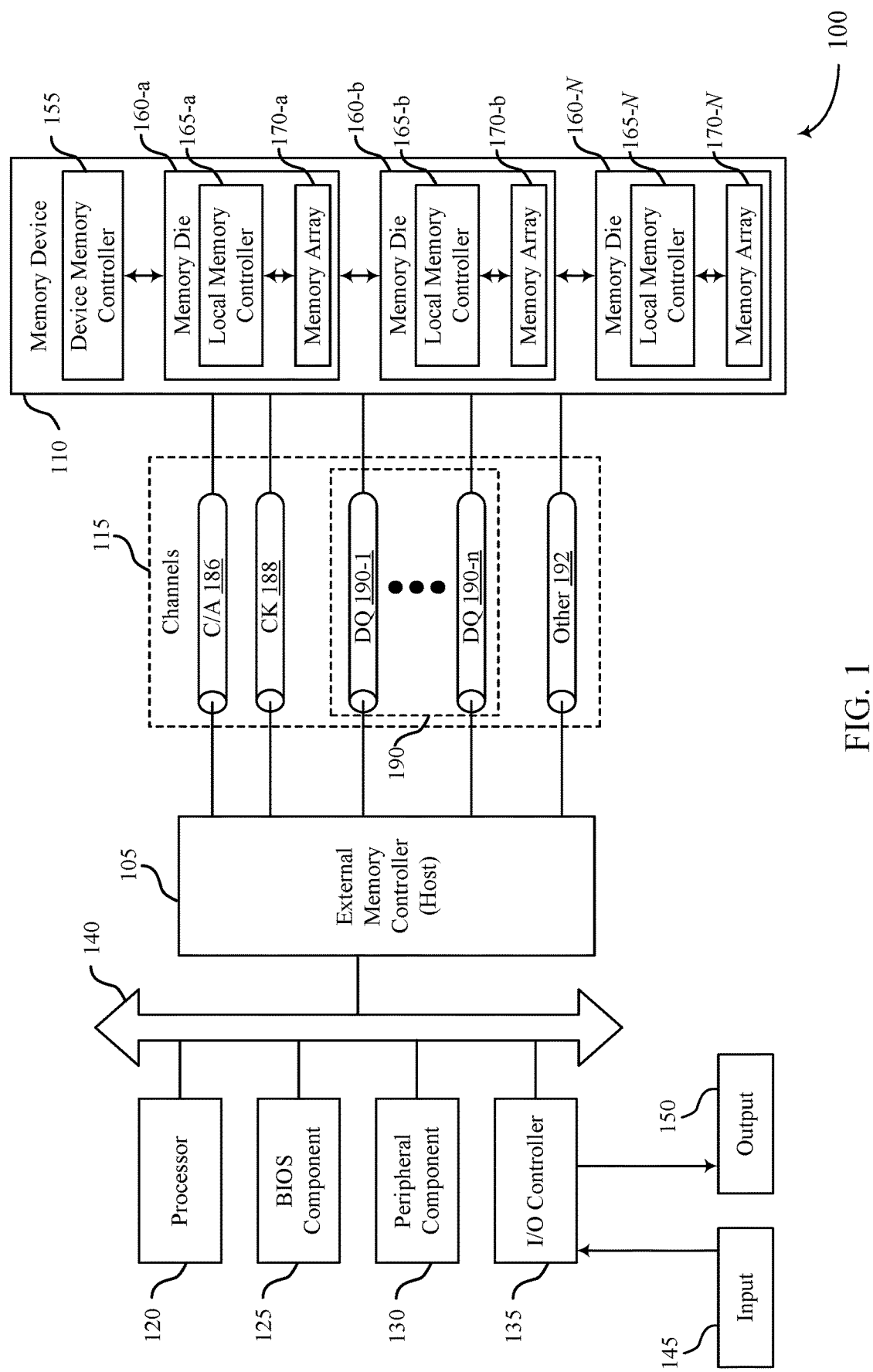
FIG. 1 illustrates aspects of an exemplary system that supports reporting control information errors as disclosed herein.

Electronic signaling including control information (which may be referred to herein as control signaling) and data (which may be referred to herein as control signaling data signaling) may be communicated within a memory system. The control information included in control signaling may include commands, addresses, or error detection/correction information, or a combination thereof. In some cases, errors—e.g., due to transmission, reception, signal lane, and/or timing errors—may be detected in control information.

In some cases, after detecting an error in received (e.g., in control information), a device that receives the control information (e.g., a memory device) may discard the control information—such as refraining from executing a command in the control information—and indicate, to a device that transmitted the control information (e.g., a host device), that an error was detected in the received control information. However, receiving an indication that an error occurred at the memory device, may not indicate to the host device what type of error occurred or what caused the error to occur, among other information. That is, the memory device may be able to detect the error but may not determine, or not be capable of determining, the cause or nature of the error.

To enable a host device to better diagnose a cause, nature, or both of an error in communicated control information, a receiving device may provide the host device with additional information (e.g., regarding the cause and nature of an error detected in the control information). For example, the receiving device may transmit, to the host device, at least a portion of if not a full stored copy of at least a portion of a received control signal that included corrupted control information. And the host device may then use the information (e.g., copy) of the received control signal to determine a cause of the error—e.g., by comparing the received control signal against the transmitted control signal. By allowing the host device to diagnose a cause or nature of the error in some cases, the host device may be able to take measures to correct or avoid the error in subsequent communications (e.g., by updating a modulation scheme or avoiding a damaged signal path). In some examples, a command register and accompanying logic components may be included in the memory device to store a failed control signal.

In some cases, the memory device may enter a locked state until the host device identifies and/or resolves a cause of the error. Entering a locked state may include refraining from executing received commands and closing all of the memory banks at the memory device. By entering a locked state, the memory device may preserve information stored in a memory array at the memory device. After entering the locked state, however, the memory device may be unable to return to its prior state without the assistance of another device, such as the host device.

To support the locked state of the memory device, the memory device may store (e.g., continuously store) a state of the memory array during normal operation (e.g., not locked operation) and may transmit, to a host device, the state of the memory array that was stored before/when an error is detected in received control information. For example, the memory device may store (e.g., continuously store), based on the most recent data for each memory bank in a memory array, a memory address of the most recently accessed row in a memory bank and a state of each memory bank (e.g., whether a memory bank is opened or closed). In some examples, a register file and accompanying logic components may be included in the memory device to store the memory address and bank state (which collectively may be referred to as a "memory state" or "memory state information") for a memory array.

Features of the disclosure introduced above are further described below in the context of a memory system with reference to FIGS. 1-2. Specific examples are then described of memory devices, timing diagrams, flow charts, and process flows for reporting control information errors with reference to FIGS. 3-8. These and other features of the disclosure are further illustrated by and described with reference to apparatus diagrams, system diagrams, and flowcharts that relate to reporting control information errors as described with reference to FIGS. 9-12.

FIG. 1 illustrates aspects of an exemplary system that supports reporting control information errors as disclosed herein. The system 100 may include an external memory controller 105, a memory device 110, and a plurality of channels 115 coupling the external memory controller 105 with the memory device 110. The system 100 may include one or more memory devices, but for ease of description the one or more memory devices may be described as a single memory device 110.

The system 100 may include aspects of an electronic device, such as a computing device, a mobile computing device, a wireless device, or a graphics processing device. The system 100 may be an example of a portable electronic device. The system 100 may be an example of a computer, a laptop computer, a tablet computer, a smartphone, a cellular phone, a wearable device, an internet-connected device, or the like. The memory device 110 may be component of the system configured to store data for one or more other components of the system 100. In some examples, the system 100 is configured for bi-directional wireless communication with other systems or devices using a base station or access point. In some examples, the system 100 is capable of machine-type communication (MTC), machine-to-machine (M2M) communication, or device-to-device (D2D) communication.

At least portions of the system 100 may be examples of a host device. Such a host device may be an example of a device that uses memory to execute processes such as a computing device, a mobile computing device, a wireless device, a graphics processing device, a graphic processing unit (GPU), general purpose GPU (GPGPU), a central processing unit (CPU), a computer, a laptop computer, a tablet computer, a smartphone, a cellular phone, a wearable device, an internet-connected device, some other stationary or portable electronic device, or the like. In some cases, the host device may refer to the hardware, firmware, software, or a combination thereof that implements the functions of the external memory controller 105. In some cases, the external memory controller 105 may be referred to as a host or host device. In some examples, system 100 may be a graphics card. The host device may include a plurality of drivers and a plurality of channels linking the host device with the memory device.

In some cases, a memory device 110 may be an independent device or component that is configured to be in communication with other components of the system 100 and provide physical memory addresses/space to potentially be used or referenced by the system 100. In some examples, a memory device 110 may be configurable to work with at least one or a plurality of different types of systems 100. Signaling between the components of the system 100 and the memory device 110 may be operable to support modulation schemes to modulate the signals, different pin designs for communicating the signals, distinct packaging of the system 100 and the memory device 110, clock signaling and synchronization between the system 100 and the memory device 110, timing conventions, and/or other factors.

The memory device 110 may be configured to store data for the components of the system 100. In some cases, the memory device 110 may act as a slave-type device to the system 100 (e.g., responding to and executing commands provided by the system 100 through the external memory controller 105). Such commands may include an access command for an access operation, such as a write command for a write operation, a read command for a read operation, a refresh command for a refresh operation, or other commands. An access command may, in some cases, be a command that prompts a memory device to store or read data from one or more memory cells. The memory device 110 may include two or more memory dice 160 (e.g., memory chips) to support a desired or specified capacity for data storage. The memory device 110 including two or more memory dice may be referred to as a multi-die memory or package (also referred to as multi-chip memory or package).

The system 100 may further include a processor 120, a basic input/output system (BIOS) component 125, one or more peripheral components 130, and an input/output (I/O) controller 135. The components of system 100 may be coupled with or in electronic communication with one another using a bus 140.

The processor 120 may be configured to control at least portions of the system 100. The processor 120 may be a general-purpose processor, a digital signal processor (DSP), an application-specific integrated circuit (ASIC), a field-programmable gate array (FPGA) or other programmable logic device, discrete gate or transistor logic, discrete hardware components, or it may be a combination of these types of components. In such cases, the processor 120 may be an example of a CPU, a GPU, a GPGPU, or a system on a chip (SoC), among other examples.

In some cases, the processor 120 may be incorporated into or part of the external memory controller 105. In some cases, the processor 120 may be a GPU. The processor 120 may perform aspects of configuring bus transmission lines (e.g., data bus transmission lines) as described herein. For example, the processor 120 may divide a data bus into two sets of transmission lines: a first set to transfer control signals, and a second set to transfer data signals.

The BIOS component 125 may be a software component that includes a BIOS operated as firmware, which may initialize and run various hardware components of the system 100. The BIOS component 125 may also manage data flow between the processor 120 and the various components of the system 100, e.g., the peripheral components 130, the I/O controller 135, etc. The BIOS component 125 may include a program or software stored in read-only memory (ROM), flash memory, or any other non-volatile memory.

The peripheral component(s) 130 may be any input device or output device, or an interface for such devices, that may be integrated into or with the system 100. Examples may include disk controllers, sound controller, graphics controller, Ethernet controller, modem, universal serial bus (USB) controller, a serial or parallel port, or peripheral card slots, such as peripheral component interconnect (PCI) or specialized graphics ports. The peripheral component(s) 130 may be other components as would be understood by persons of ordinary skill in the art of peripherals.

The I/O controller 135 may manage data communication between the processor 120 and the peripheral component(s) 130, input devices 145, or output devices 150. The I/O controller 135 may manage peripherals that are not integrated into or with the system 100. In some cases, the I/O controller 135 may represent a physical connection or port to external peripheral components.

The input device 145 may represent a device or signal external to the system 100 that may provide information, signals, or data to the system 100 or its components. This may include a user interface or interface with or between other devices. In some cases, the input device 145 may be a peripheral that interfaces with system 100 via one or more peripheral components 130 or may be managed by the I/O controller 135.

The output device 150 may represent a device or signal external to the system 100 configured to receive an output from the system 100 or any of its components. Examples of the output device 150 may include a display, audio speakers, a printing device, or another processor on printed circuit board, etc. In some cases, the output device 150 may be a peripheral that interfaces with the system 100 via one or more peripheral components 130 or may be managed by the I/O controller 135.

The components of system 100 may be made up of general-purpose or special purpose circuitry designed to carry out their functions. This may include output driver circuitry and various other circuit elements, for example, conductive lines, transistors, capacitors, inductors, resistors, amplifiers, or other active or passive elements, configured to carry out the functions described herein.

The memory device 110 may include a device memory controller 155 and one or more memory dice 160. Each memory die 160 may include a local memory controller 165 (e.g., local memory controller 165-a, local memory controller 165-b, and/or local memory controller 165-N) and a memory array 170 (e.g., memory array 170-a, memory array 170-b, and/or memory array 170-N). A memory array 170 may be a collection (e.g., a grid) of memory cells, with each memory cell being configured to store at least one bit of digital data. Features of memory arrays 170 and/or memory cells are further described with reference to FIG. 2.

The memory arrays 170 may be examples of two-dimensional (2D) arrays of memory cells or may be examples of three-dimensional (3D) array of memory cells. For example, a 2D memory device may include a single memory die 160. A 3D memory device may include two or more memory dice 160 (e.g., memory die 160-a, memory die 160-b, and/or any quantity of memory dice 160-N). In a 3D memory device, multiple memory dice 160-N may be stacked on top of one another. In some cases, memory dice 160-N in a 3D memory device may be referred to as decks, levels, layers, or dies. A 3D memory device may include any quantity of stacked memory dice 160-N (e.g., two high, three high, four high, five high, six high, seven high, eight high). This may increase the quantity of memory cells that may be positioned on a substrate as compared with a single 2D memory device, which in turn may reduce production costs, increase the performance of the memory array, or both. In some 3D memory devices, different decks may share at least one common access line such that some decks may share at least one of a word line, a digit line, and/or a plate line.

The device memory controller 155 may include circuits or components configured to control operation of the memory device 110. As such, the device memory controller 155 may include the hardware, firmware, and software that enables the memory device 110 to perform commands and may be configured to receive, transmit, or execute commands, data, or control information related to the memory device 110. The device memory controller 155 may be configured to communicate with the external memory controller 105, the one or more memory dice 160, or the processor 120. In some cases, the memory device 110 may receive data and/or control signals (e.g., commands, addresses, and/or error detection information) from the external memory controller 105. For example, the memory device 110 may receive a write command indicating that the memory device 110 is to store certain data on behalf of a component of the system 100 (e.g., the processor 120) or a read command indicating that the memory device 110 is to provide certain data stored in a memory die 160 to a component of the system 100 (e.g., the processor 120). In some cases, the device memory controller 155 may control operation of the memory device 110 described herein in conjunction with the local memory controller 165 of the memory die 160. Examples of the components included in the device memory controller 155 and/or the local memory controllers 165 may include receivers for demodulating signals received from the external memory controller 105, encoders for modulating and transmitting signals to the external memory controller 105, logic, decoders, amplifiers, filters, or the like.

The local memory controller 165 (e.g., local to a memory die 160) may be configured to control operations of the memory die 160. Also, the local memory controller 165 may be configured to communicate (e.g., receive and transmit data and/or commands) with the device memory controller 155. The local memory controller 165 may support the device memory controller 155 to control operation of the memory device 110 as described herein. In some cases, the memory device 110 does not include the device memory controller 155, and the local memory controller 165 or the external memory controller 105 may perform the various functions described herein. As such, the local memory controller 165 may be configured to communicate with the device memory controller 155, with other local memory controllers 165, or directly with the external memory controller 105 or the processor 120.

The external memory controller 105 may be configured to enable communication of information, data, commands and/or addresses between components of the system 100 (e.g., the processor 120) and the memory device 110. The external memory controller 105 may act as a liaison between the components of the system 100 and the memory device 110 so that the components of the system 100 may not need to know the details of the memory device's operation. The components of the system 100 may present requests to the external memory controller 105 (e.g., read commands or write commands) that the external memory controller 105 satisfies. The external memory controller 105 may convert or translate communications exchanged between the components of the system 100 and the memory device 110. In some cases, the external memory controller 105 may include a system clock that generates a common (source) system clock signal. In some cases, the external memory controller 105 may include a common data clock that generates a common (source) data clock signal.

In some cases, the external memory controller 105 or other components of the system 100, or its functions described herein, may be implemented by the processor 120. For example, the external memory controller 105 may be hardware, firmware, or software, or some combination thereof implemented by the processor 120 or other component of the system 100. Although the external memory controller 105 is depicted as being external to the memory device 110, in some cases, the external memory controller 105, or its functions described herein, may be implemented by a memory device 110. For example, the external memory controller 105 may be hardware, firmware, or software, or some combination thereof implemented by the device memory controller 155 or one or more local memory controllers 165. In some cases, the external memory controller 105 may be distributed across the processor 120 and the memory device 110 such that portions of the external memory controller 105 are implemented by the processor 120 and other portions are implemented by a device memory controller 155 or a local memory controller 165. Likewise, in some cases, one or more functions ascribed herein to the device memory controller 155 or local memory controller 165 may in some cases be performed by the external memory controller 105 (either separate from or as included in the processor 120).

The components of the system 100 may exchange information with the memory device 110 using a plurality of channels 115. In some examples, the channels 115 may enable communications between the external memory controller 105 and the memory device 110. Each channel 115 may include one or more signal paths or transmission mediums (e.g., conductors) between terminals associated with the components of system 100. For example, a channel 115 may include a first terminal including one or more pins or pads at external memory controller 105 and one or more pins or pads at the memory device 110. A pin may be an example of a conductive input or output point of a device of the system 100, and a pin may be configured to act as part of a channel. In some cases, a pin or pad of a terminal may be part of to a signal path of the channel 115.

Additional signal paths may be coupled with a terminal of a channel for routing signals within a component of the system 100. For example, the memory device 110 may include signal paths (e.g., signal paths internal to the memory device 110 or its components, such as internal to a memory die 160) that route a signal from a terminal of a channel 115 to the various components of the memory device 110 (e.g., a device memory controller 155, memory dice 160, local memory controllers 165, memory arrays 170). A signal path may be implemented using one or more types of transmission lines, including differential transmission lines and single-ended transmission lines.

Channels 115 (and associated signal paths and terminals) may be dedicated to communicating specific types of information. In some cases, a channel 115 may be an aggregated channel and thus may include multiple individual channels. For example, a data channel 190 may be ×4 (e.g., including four signal paths), ×8 (e.g., including eight signal paths), ×16 (including sixteen signal paths), and so forth. Signals communicated over the channels may use double data rate (DDR) signaling. For example, some symbols of a signal may be registered on a rising edge of a clock signal and other symbols of the signal may be registered on a falling edge of the clock signal. Signals communicated over channels may use single data rate (SDR) signaling. For example, one symbol of the signal may be registered for each clock cycle.

In some cases, the channels 115 may include one or more command and address (C/A) channels 186. The C/A channels 186 may be configured to communicate commands between the external memory controller 105 and the memory device 110 including control information associated with the commands (e.g., address information). For example, the C/A channel 186 may include a read command with an address of the desired data. In some cases, the C/A channels 186 may be registered on a rising clock signal edge and/or a falling clock signal edge. In some cases, a C/A channel 186 may include multiple (e.g., eight or nine) signal paths.

In some cases, the channels 115 may include one or more clock signal (CK) channels 188. The CK channels 188 may be configured to communicate one or more common clock signals between the external memory controller 105 and the memory device 110. Each clock signal may be configured to adjust (e.g., oscillate) between a high state and a low state and coordinate the actions of the external memory controller 105 and the memory device 110. In some cases, the clock signal may be a differential output (e.g., a CK_t signal and a CK c signal) and the signal paths of the CK channels 188 may be configured accordingly. In some cases, the clock signal may be single ended. A CK channel 188 may include any quantity of signal paths. In some cases, the clock signal CK (e.g., a CK_t signal and a CK c signal) may provide a timing reference for command and addressing operations for the memory device 110, or other system-wide operations for the memory device 110. The clock signal CK therefore may be variously referred to as a control clock signal CK, a command clock signal CK, or a system clock signal CK. The system clock signal CK may be generated by a system clock, which may include one or more hardware components (e.g., oscillators, crystals, logic gates, transistors, or the like).

In some cases, the channels 115 may include one or more data (DQ) channels 190. For example, the channels 115 may include data channels 190-1 through 190-*n*. Each data channel may be associated with or include one or more transmission lines. The data channels 190 may be configured to communicate data and/or control information between the external memory controller 105 and the memory device 110. For example, the data channels 190 may communicate information (e.g., bi-directional) to be written to the memory device 110 or information read from the memory device 110.

In some cases, the channels 115 may include one or more other channels 192 that may be dedicated to other purposes. These other channels 192 may include any quantity of signal paths.

In some cases, the other channels 192 may include one or more write clock signal (WCK) channels. Although the 'W' in WCK may nominally stand for "write," a write clock signal WCK (e.g., a WCK t signal and a WCK c signal) may provide a timing reference for access operations generally for the memory device 110 (e.g., a timing reference for both read and write operations). Accordingly, the write clock signal WCK may also be referred to as a data clock signal WCK. The WCK channels may be configured to communicate a common data clock signal between the external memory controller 105 and the memory device 110. The data clock signal may be configured to coordinate an access operation (e.g., a write operation or read operation) of the external memory controller 105 and the memory device 110. In some cases, the write clock signal may be a differential output (e.g., a WCK t signal and a WCK c signal) and the signal paths of the WCK channels may be configured accordingly. A WCK channel may include any quantity of signal paths. The data clock signal WCK may be generated by a data clock, which may include one or more hardware components (e.g., oscillators, crystals, logic gates, transistors, or the like).

In some cases, the other channels 192 may include one or more error detection code (EDC) channels. The EDC channels may be configured to communicate error detection signals, such as checksums, to improve system reliability. An EDC channel may include any quantity of signal paths.

The channels 115 may couple the external memory controller 105 with the memory device 110 using a variety of different architectures. Examples of the various architectures may include a bus, a point-to-point connection, a crossbar, a high-density interposer such as a silicon interposer, or channels formed in an organic substrate or some combination thereof. For example, in some cases, the signal paths may at least partially include a high-density interposer, such as a silicon interposer or a glass interposer.

Different types of signals may be transmitted over channels 115. In some cases, a control signal including both a command and a memory address is referred to as a C/A signal. In one example, a C/A signal including an activate ("ACT") command and a row address may indicate to a memory device that a row of memory cells is to be activated in preparation for or in conjunction with another memory operation (e.g., a read or write operation). Activating a memory cell may refer to energizing the word line corresponding to that memory cell. When an ACT command is transferred to the memory device, the ACT command may include or be followed by a quantity of address bits that indicate the bank targeted for an upcoming read or write operation, as well as the row within that bank that is to be activated. Thus, a transmitted ACT command may include or be followed by the bank and row addresses relevant to the upcoming memory operation. When an ACT command includes a row address, the ACT command may be referred to as a row command. An external controller may transmit an ACT command each time a new row in a bank is targeted for a read or write operation.

A precharge ("PRE") command may indicate to a memory device that a memory bank is to be closed. Closing a memory bank may include removing an applied voltage from a word line in the memory bank and closing any rows that were opened by a previous ACT command. An external controller may transmit a PRE command after an ACT command has been used to open a row in a memory bank—e.g., to enable the opening of a different row in the same memory bank.

A read ("RD") command may indicate to a memory device that one or more memory cells are to undergo a read operation so that their stored information (e.g., as represented by logic states) can be transferred to an external controller. Reading a memory cell may refer to the process of applying a voltage across the memory cell so that the memory cell discharges onto a digit line for sensing. When a read command is transmitted to the memory device, the read command may include or be followed by the bank address and column address of the memory cell(s) targeted for the read operation. When a read command includes a column address, the read command may be referred to as a column command. In some cases, the read command may also indicate the quantity of memory cells that are to be read, starting at an initial address point. The quantity of memory cells to be read in response to a read command may be referred to as the read burst length.

A write ("WR") command may indicate to a memory device that one or more memory cells are to undergo a write operation so that information from an external controller can be stored in one of the memory banks of a memory device. Writing a memory cell may refer to the process of applying a voltage across the memory cell so that the memory cell charges to a state indicative of a logic one or zero. When a write command is transmitted to the memory device, the write command may include or be followed by the bank address and column address of the memory cell(s) targeted for the write operation. When a write command includes a column address, the write command may be referred to as a column command. In some cases, the write command may also indicate the quantity of memory cells that are to be written, starting at an initial address point. The quantity of memory cells to be written in response to a write command may be referred to as the write burst length.

Signals communicated over the channels 115 (and their associated transmission lines) may be modulated using a variety of different modulation schemes. In some cases, a binary-symbol (or binary-level) modulation scheme may be used to modulate signals communicated between the external memory controller 105 and the memory device 110. A binary-symbol modulation scheme may be an example of an M-ary modulation scheme where M is equal to two. Each symbol of a binary-symbol modulation scheme may be configured to represent one bit of digital data (e.g., a symbol may represent a logic 1 or a logic 0). Examples of binary-symbol modulation schemes include, but are not limited to, NRZ, unipolar encoding, bipolar encoding, Manchester encoding, PAM having two symbols (e.g., PAM2), and/or others.

In some cases, a multi-symbol (or multi-level) modulation scheme may be used to modulate signals communicated between the external memory controller 105 and the memory device 110. A multi-symbol modulation scheme may be an example of a M-ary modulation scheme where M is greater than or equal to three. Each symbol of a multi-symbol modulation scheme may be configured to represent more than one bit of digital data (e.g., a symbol may represent a logic 00, a logic 01, a logic 10, or a logic 11). Examples of multi-symbol modulation schemes include, but are not limited to, PAM4, PAM8, etc., quadrature amplitude modulation (QAM), quadrature phase shift keying (QPSK), and/or others. A multi-symbol signal (e.g., a PAM4 signal) may be a signal that is modulated using a modulation scheme that includes at least three levels to encode more than one bit of information. Multi-symbol modulation schemes and symbols may alternatively be referred to as non-binary, multi-bit, or higher-order modulation schemes and symbols.

As discussed herein, signaling including control information ("control signaling") and data ("data signaling") may be communicated within a memory system—e.g., between host device 105 and memory device 110. The control information included in control signaling may include commands, addresses, and/or error detection/correction information. In some cases, errors may be detected in control information—e.g., due to transmission, reception, signal lane, and/or timing errors. In some cases, after detecting an error in received control information, a device that receives the control information (the "memory device") may discard the control information—e.g., refrain from executing a command in the control information—and indicate, to a device that transmitted the control information (the "host device"), that an error was detected in the received control information. However, receiving an indication that an error occurred at the memory device, may not indicate to the host device what type of error occurred or what caused the error to occur. That is, the memory device may be able to detect the error but may not determine, or not be capable of determining, the cause or nature of the error. Additionally, the memory device may be unable to determine which command the host actually transmitted or intended to transmit to the memory device.

To enable a host device to diagnose a cause and/or nature of an error in communicated control information, a receiving device may provide the host device with additional information regarding the cause and nature of an error detected in the control information. For example, the receiving device may transmit, to the host device, at least a portion of if not a full stored copy of at least a portion of a received control signal that included corrupted control information. And the host device may then use the portion or full stored copy of the received control signal to determine a cause of the error—e.g., by comparing the received control signal against the transmitted control signal. By allowing the host device to diagnose a cause or nature of the error, the host device may be able to take measures to correct or avoid the error in subsequent communications (e.g., by updating a modulation scheme or avoiding a damaged signal path). In some examples, a command register and accompanying logic components may be included in the memory device to store a failed control signal.

In some cases, the memory device may enter a locked state until the host device identifies and/or resolves a cause of the error. Entering a locked state may include refraining from executing received commands and closing all of the memory banks at the memory device. By entering a locked state, the memory device may preserve information stored in a memory array at the memory device until the cause of the error has been resolved. However, after entering the locked state, the memory device may be unable to return to its prior state without the assistance of another device, such as the host device.

To support the locked state of the memory device and to enable the memory device to fully recover from an error, the memory device may continuously store a state of the memory array during normal operation (e.g., not locked operation) and may transmit, to a host device, the state of the memory array that was stored before/when an error is detected in received control information. For example, the memory device may continuously store, based on the most recent data for each memory bank in a memory array, a memory address of the most recently accessed row in a memory bank and a state of each memory bank (e.g., whether a memory bank is opened or closed). In some examples, a register file and accompanying logic components may be included in the memory device to store the memory address (e.g., row address) and bank state (which collectively may be referred to as a "memory state" or "memory state information") for a memory array.

Figure 2:
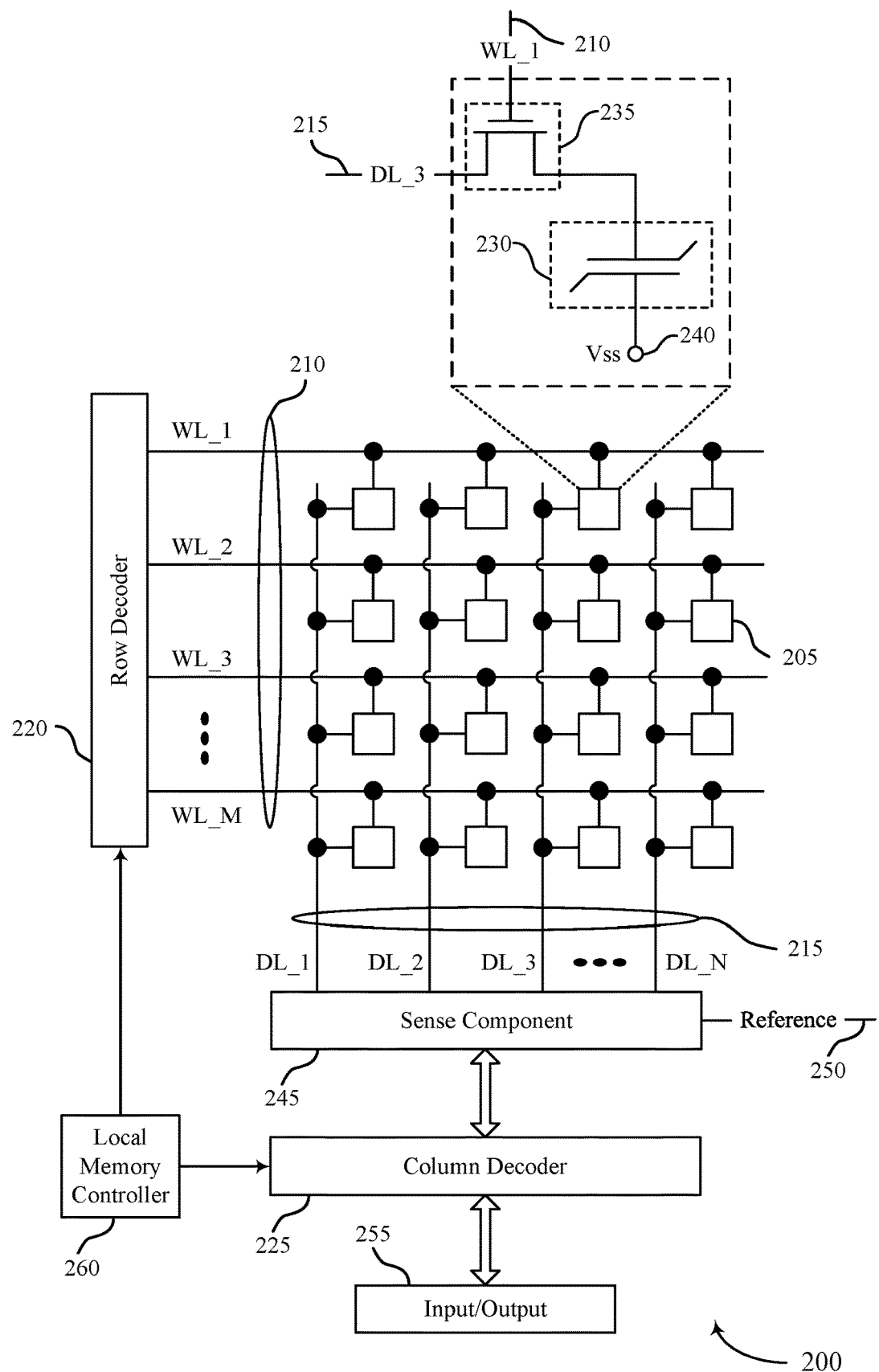
FIG. 2 illustrates aspects of an exemplary memory device that supports reporting control information errors as disclosed herein.

FIG. 2 illustrates aspects of an exemplary memory device that supports reporting control information errors as disclosed herein.

The memory device 200 may be an example of the memory dice 160 described with reference to FIG. 1. In some cases, the memory device 200 may be referred to as a memory chip, a memory device, or an electronic memory apparatus. The memory device 200 may include one or more memory cells 205 that are programmable to store different logic states. Each memory cell 205 may be programmable to store two or more states. For example, the memory cell 205 may be configured to store one bit of digital logic at a time (e.g., a logic 0 and a logic 1). In some cases, a single memory cell 205 (e.g., a multi-level memory cell) may be configured to store more than one bit of digit logic at a time (e.g., a logic 00, logic 01, logic 10, or a logic 11).

A memory cell 205 may store a charge representative of the programmable states in a capacitor. In dynamic random access memory (DRAM) architectures, a memory cell, such as memory cell 205, may include a capacitor that includes a dielectric material to store a charge representative of the programmable state. In other memory architectures, other storage devices and components are possible. For example, nonlinear dielectric materials may be employed.

Operations such as reading and writing may be performed on memory cells 205 by activating or selecting access lines such as a word line 210 and/or a digit line 215. In some cases, digit lines 215 may also be referred to as bit lines. References to access lines, word lines and digit lines, or their analogues, are interchangeable without loss of understanding or operation. Activating or selecting a word line 210 or a digit line 215 may include applying a voltage to the respective line.

The memory device 200 may include the access lines (e.g., the word lines 210 and the digit lines 215) arranged in a grid-like pattern. Memory cells 205 may be positioned at intersections of the word lines 210 and the digit lines 215. By biasing a word line 210 and a digit line 215 (e.g., applying a voltage to the word line 210 or the digit line 215), a single memory cell 205 may be accessed at their intersection. The memory device 200 may include a quantity of memory banks, at least some of which, if not each of which, may have a unique address and which may include a multitude of rows and columns.

Accessing the memory cells 205 in a memory bank may be controlled through a row decoder 220 or a column decoder 225. For example, a row decoder 220 may receive a row address from the local memory controller 260 and activate a word line 210 based on the received row address. A column decoder 225 may receive a column address from the local memory controller 260 and may activate a digit line 215 based on the received column address. For example, the memory device 200 may include multiple word lines 210, labeled WL_1 through WL_M, and multiple digit lines 215, labeled DL_1 through DL_N, where M and N depend on the size of the memory array. Thus, by activating a word line 210 and a digit line 215, e.g., WL_1 and DL_3, the memory cell 205 at their intersection may be accessed. The intersection of a word line 210 and a digit line 215, in either a two-dimensional or three-dimensional configuration, may be referred to as an address of a memory cell 205.

The memory cell 205 may include a logic storage component, such as capacitor 230 and a switching component 235. The capacitor 230 may be an example of a dielectric capacitor or a ferroelectric capacitor. A first node of the capacitor 230 may be coupled with the switching component 235 and a second node of the capacitor 230 may be coupled with a voltage source 240. In some cases, the voltage source 240 is a ground such as Vss. In some cases, the voltage source 240 may be an example of a plate line coupled with a plate line driver. The switching component 235 may be an example of a transistor or any other type of switch device that selectively establishes or de-establishes (e.g., ceases) electronic communication between two components.

Selecting or deselecting the memory cell 205 may be accomplished by activating or deactivating the switching component 235. The capacitor 230 may be in electronic communication with the digit line 215 using the switching component 235. For example, the capacitor 230 may be isolated from digit line 215 when the switching component 235 is deactivated, and the capacitor 230 may be coupled with digit line 215 when the switching component 235 is activated. In some cases, the switching component 235 may be or include a transistor and its operation may be controlled by applying a voltage to the transistor gate, where the voltage differential between the transistor gate and transistor source may be greater or less than a threshold voltage of the transistor. In some cases, the switching component 235 may be or include a p-type transistor or an n-type transistor. The word line 210 may be in electronic communication with the gate of the switching component 235 and may activate/deactivate the switching component 235 based on a voltage being applied to word line 210.

A word line 210 may be a conductive line in electronic communication with a memory cell 205 that may be used to perform access operations on the memory cell 205. In some architectures, the word line 210 may be in electronic communication with a gate of a switching component 235 of a memory cell 205 and may be configured to control the switching component 235 of the memory cell. In some architectures, the word line 210 may be in electronic communication with a node of the capacitor of the memory cell 205 and the memory cell 205 may not include a switching component.

A digit line 215 may be a conductive line that connects the memory cell 205 with a sense component 245. In some architectures, the memory cell 205 may be selectively coupled with the digit line 215 during portions of an access operation. For example, the word line 210 and the switching component 235 of the memory cell 205 may be configured to couple and/or isolate the capacitor 230 of the memory cell 205 and the digit line 215. In some architectures, the memory cell 205 may be in electronic communication with the digit line 215.

The sense component 245 may be configured to detect a state (e.g., a charge) stored on the capacitor 230 of the memory cell 205 and determine a logic state of the memory cell 205 based on the stored state. The charge stored by a memory cell 205 may be small, in some cases. As such, the sense component 245 may include one or more sense amplifiers to amplify the signal output by the memory cell 205. The sense amplifiers may detect small changes in the charge of a digit line 215 during a read operation and may produce signals corresponding to a logic state 0 or a logic state 1 based on the detected charge. During a read operation, the capacitor 230 of memory cell 205 may output a signal (e.g., discharge a charge) to its corresponding digit line 215. The signal may cause a voltage of the digit line 215 to change. The sense component 245 may be configured to compare the signal received from the memory cell 205 across the digit line 215 to a reference signal 250 (e.g., reference voltage). The sense component 245 may determine the stored state of the memory cell 205 based on the comparison. For example, in binary-signaling, if digit line 215 has a higher voltage than the reference signal 250, the sense component 245 may determine that the stored state of memory cell 205 is a logic 1 and, if the digit line 215 has a lower voltage than the reference signal 250, the sense component 245 may determine that the stored state of the memory cell 205 is a logic 0.

The sense component 245 may include various transistors or amplifiers to detect and amplify a difference in the signals. In some cases, the sense component 245 may be part of another component (e.g., a column decoder 225, row decoder 220). In some cases, the sense component 245 may be in electronic communication with the row decoder 220 or the column decoder 225.

The detected logic states of memory cells 205, as determined by the sense component 245 as one example, may be output through column decoder 225 as output 255. Output 255 may pass the detected logic states to one or more intermediary components (e.g., a local memory controller) for transfer over one or more channels (e.g., for transmission over one or more transmission lines). Thus, the detected logic state of memory cells 205 may be conveyed to devices or components external to memory device 200. For example, the detected logic states may be transferred (e.g., to an external memory controller 105) via one or more transmission lines.

The local memory controller 260 may control the operation of memory cells 205 through the various components (e.g., row decoder 220, column decoder 225, and sense component 245). The local memory controller 260 may be an example of the local memory controller 165 described with reference to FIG. 1. In some cases, one or more of the row decoder 220, column decoder 225, and sense component 245 may be co-located with the local memory controller 260. The local memory controller 260 may be configured to receive commands and/or data from an external memory controller 105 (or a device memory controller 155 described with reference to FIG. 1), translate the commands and/or data into information that can be used by the memory device 200, perform one or more operations on the memory device 200, and communicate data from the memory device 200 to the external memory controller 105 (or the device memory controller 155) in response to performing the one or more operations. The local memory controller 260 may generate row and column address signals to activate the target word line 210 and the target digit line 215. The local memory controller 260 may also generate and control various voltages or currents used during the operation of the memory device 200. In general, the amplitude, shape, or duration of an applied voltage or current discussed herein may be adjusted or varied and may be different for the various operations discussed in operating the memory device 200.

In some cases, the local memory controller 260 may be configured to perform a write operation (e.g., a programming operation) on one or more memory cells 205 of the memory device 200. The write operation may be for data received from an external device. During a write operation, a memory cell 205 of the memory device 200 may be programmed to store a desired logic state. In some cases, a plurality of memory cells 205 may be programmed during a single write operation. The local memory controller 260 may identify a target memory cell 205 on which to perform the write operation. The local memory controller 260 may identify a target word line 210 and a target digit line 215 in electronic communication with the target memory cell 205 (e.g., the address of the target memory cell 205). The local memory controller 260 may activate the target word line 210 and the target digit line 215 (e.g., applying a voltage to the word line 210 or digit line 215), to access the target memory cell 205. The local memory controller 260 may apply a first signal (e.g., voltage) to the digit line 215 during the write operation to store a first state (e.g., charge) in the capacitor 230 of the memory cell 205, and the first state (e.g., charge) may be indicative of a desired logic state.

In some cases, the local memory controller 260 may be configured to perform a read operation (e.g., a sense operation) on one or more memory cells 205 of the memory device 200. The read operation may be for data requested by, or intended for, an external device. During a read operation, the logic state stored in a memory cell 205 of the memory device 200 may be determined. In some cases, a plurality of memory cells 205 may be sensed during a single read operation. The local memory controller 260 may identify a target memory cell 205 on which to perform the read operation. The local memory controller 260 may identify a target word line 210 and a target digit line 215 in electronic communication with the target memory cell 205 (e.g., the address of the target memory cell 205). The local memory controller 260 may activate the target word line 210 and the target digit line 215 (e.g., applying a voltage to the word line 210 or digit line 215), to access the target memory cell 205.

The local memory controller 260 may be configured to store memory state information (e.g., the most recently accessed row address and memory bank state for each memory bank) during operation of memory device 200. In some cases, the local memory controller 260 may be configured to cause the memory device 200 to enter a locked state after detecting an error in received control information. The local memory controller 260 may also be configured to cause the memory device to store a copy of all or a portion of a control signal after detecting an error in control information received in the control signal. Additionally, the local memory controller 260 may cause the memory device 200 to transmit the memory state information and/or the at least a portion of or full copy of the failed control signal to an external device, such as a host device, after detecting the error or in response to a request from the external device.

The target memory cell 205 may transfer a signal to the sense component 245 in response to biasing the access lines. The sense component 245 may amplify the signal. The local memory controller 260 may activate (or "fire") the sense component 245 (e.g., latch the sense component) and thereby compare the signal received from the memory cell 205 to the reference signal 250. Based on that comparison, the sense component 245 may determine a logic state that is stored on the memory cell 205. The local memory controller 260 may communicate the logic state stored on the memory cell 205 to the external memory controller 105 (or the device memory controller 155) as part of the read operation.

In some memory architectures, accessing the memory cell 205 may degrade or destroy the logic state stored in a memory cell 205. For example, a read operation performed in DRAM architectures may partially or completely discharge the capacitor of the target memory cell. The local memory controller 260 may perform a re-write operation or a refresh operation to return the memory cell to its original logic state. The local memory controller 260 may re-write the logic state to the target memory cell after a read operation. In some cases, the re-write operation may be considered part of the read operation.

Figure 3:
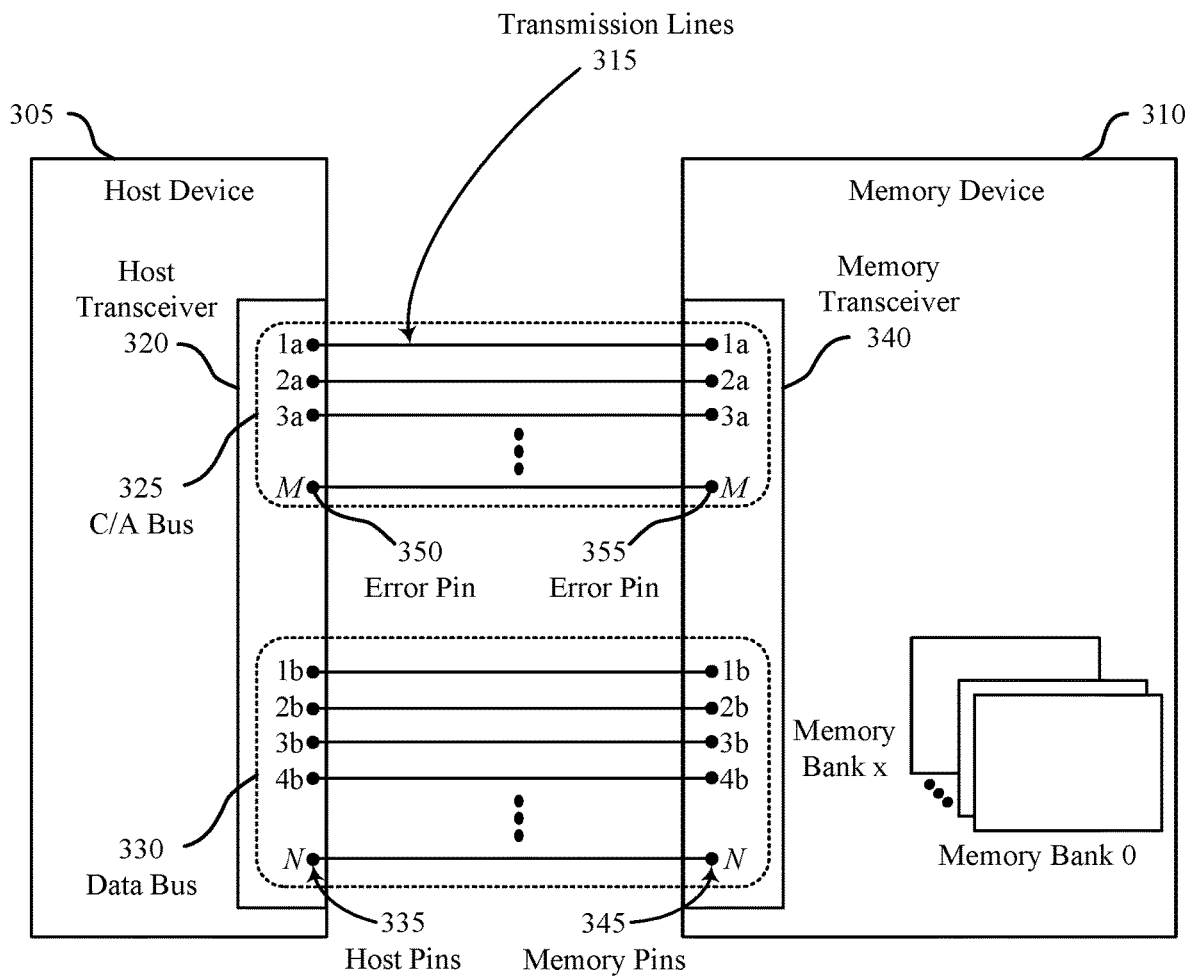
FIG. 3 illustrates aspects of an exemplary system that supports reporting control information errors as disclosed herein.

FIG. 3 illustrates aspects of an exemplary system that supports reporting control information errors as disclosed herein.

System 300 may be an example of a system 100 described with reference to FIG. 1. System 300 may include host device 305, memory device 310, and transmission lines 315. In some cases, host device 305 may be an example of an external memory controller 105 (also referred to as an external controller, host device controller, or host) or a processor 120 (e.g., a GPU, a GPGPU, a CPU), as described with reference to FIG. 1. In some cases, memory device 310 may be an example of a memory device 110, memory die 160, device memory controller 155, local memory controller 165, or memory device 200, as described with reference to FIGS. 1 and 2.

Host device 305 may be configured to communicate control and data information to memory device 310. As discussed herein, host device 305 may also be configured to receive, from memory device 310, an indication that memory device 310 failed to properly decode control information received from host device 305 (e.g., based on a filed CRC operation). After receiving the indication, host device 305 (among other devices) may be configured to identify and resolve the error(s) that caused the control information transmission failure (e.g., based on additional information received from memory device 310). Host device 305 may be further configured to return memory device 310 to a state that was identified before memory device 310 after identifying and resolving the errors. In some cases, host device 305 may include host transceiver 320 and host pins 335.

Host transceiver 320 may be configured to transmit signaling that conveys control and/or data information to memory device 310 and to receive signaling that conveys control and/or data information from memory device 310. Host transceiver 320 may include and/or be in electronic communication with host pins 335.

Host pins 335 may be configured to provide an interface between host transceiver 320 and transmission lines 315. That is, host pins 335 may facilitate the transmission of internal signals at host device 305 to other devices. In some cases, pins located at host device 305 (e.g., controller pin 1a ("CP_1a")) may correspond to pins located at memory device 310 (e.g., memory device pin 1a ("MDP_1a")). In some cases, host pins 335 may be referred to as nodes, pads, terminals, transmission line interfaces, interface components, or connection points). In some cases, host pins 335 may be made of a conductive material that is capable of transferring current or voltage to and from the transmission lines 315 and host device 305. In some cases, host pins 335 include error pin 350. Error pin 350 may be configured to communicate, between host device 305 and memory device 310, an indication that memory device 310 failed to successfully decode received control information (e.g., based on a CRC or parity error).

Memory device 310 may be configured to process control and data information received from host device 305 and to provide data information to host device 305. Memory device 310 may store information in the memory cells of one or more memory banks (e.g., in memory banks 0 through x). The memory cells may be arranged in the memory banks in sets of rows and columns, for example, as described with reference to FIG. 2.

Memory device 310 may be further configured to detect errors in control information received from host device 305. After detecting the errors, memory device 310 may indicate to host device 305 that an error occurred at memory device 310 (e.g., while processing control information received from host device 305). Memory device 310 may be configured to transmit additional information to host device 305 after detecting an error, including address and bank state information and/or at least a portion of or a full copy of the received control signal that carried the corrupted control information. In some cases, memory device 310 may include memory transceiver 340 and memory pins 345.

Memory transceiver 340 may be configured to receive control and/or data information from host device 305. Memory transceiver 340 may also be configured to transmit control and/or data information to host device 305.

Memory pins 345 may be configured to provide an interface between the transmitting and receiving components of memory device 310 and transmission lines 315. In some cases, pins located at memory device 310 (e.g., device pin 1a ("MDP_1a")) may correspond to pins located at host device 305 (e.g., controller pin 1a ("CP_1a")). In some cases, memory pins 345 may be referred to as nodes, pads, terminals, transmission line interfaces, interface components, or connection points). In some cases, the memory pins 345 may be made of a conductive material that is capable of transferring current or voltage to and from the transmission lines 315 and memory device 310. In some cases, memory pins 345 include error pin 355. Error pin 355 may be configured to communicate, between host device 305 and memory device 310, an indication that memory device 310 failed to successfully decode received control information (e.g., based on a CRC or parity error). In some cases, memory device 310 may include additional error pins to error pin 355.

Transmission lines 315 may be configured to electronically connect host device 305 and memory device 310. As shown in system 300, transmission lines 315 may originate at one component (e.g., host device 305) and terminate at another component (e.g., memory device 310) which may or may not be within the same device. Transmission lines 315 may be conductive wires or traces. In some cases, transmission lines 315 provide a one-to-one mapping between host pins 335 and memory pins 345. In some cases, transmission lines 315 are included in a channel, such as a channel 115 as described with reference to FIG. 1. For example, transmission lines 1a through M may be included in a control channel, such as C/A channel 185) and transmission lines 1b to N may be included in a data channel, such as DQ channel 190-1.

C/A bus 325 may be configured to communicate C/A signaling between host device 305 and memory device 310. In some cases, C/A bus 325 includes a subset of host pins 335 (e.g., CP_1a to CP_M), a subset of memory pins 345 (e.g., MDP_1a to MDP_M), and a subset of transmission lines 315 (e.g., TL_1a to TL_M). In other cases, C/A bus 325 is defined to include the subset of transmission lines 315 and is equivalent to a channel, such as a channel 115 as described with reference to FIG. 1. In some cases, C/A bus 325 may also be configured to include error pin 350 and error pin 355. In some cases, host device 305 may include additional error pins to error pin 350. In other cases, memory device error pins, including at least error pin 350, and host device error pins, including at least error pin 355, may not be included in a bus or included in a different bus, such as an error correction/detection bus.

Data bus 330 may be configured to communicate data signaling between host device 305 and memory device 310. In some cases, data bus 330 includes a subset of host pins 335 (e.g., CP_1b to CP_N), a subset of memory pins 345 (e.g., MDP_1b to MDP_N), and a subset of transmission lines 315 (e.g., TL_1b to TL_N). In some cases, data signals communicated over data bus 330 correspond to C/A signals transmitted over C/A bus 325—e.g., instructions for processing data information conveyed in a data signal may be included in a prior C/A signal.

Figure 4:
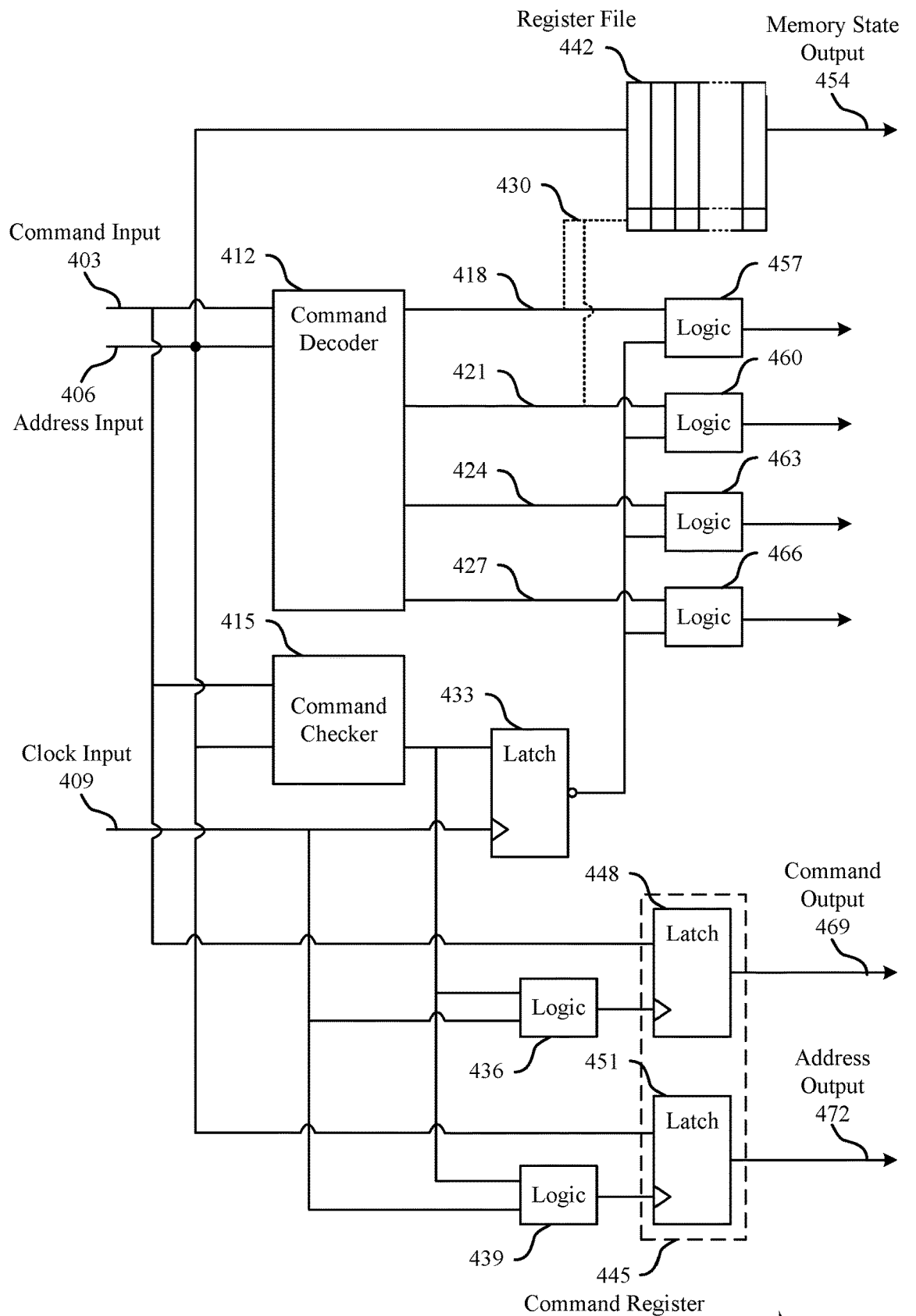
FIG. 4 illustrates aspects of an exemplary memory device that supports reporting control information errors as disclosed herein.

FIG. 4 illustrates aspects of an exemplary memory device that supports reporting control information errors as disclosed herein.

Memory device 400 may be configured to detect errors in control information received from a host device and to report to the host device that an error was detected. In addition to reporting to the host device that an error was detected, memory device 400 may be further configured to store and transmit memory array state information (e.g., row address and bank states) to the host device. Memory device 400 may also be further configured to store and transmit a version (e.g., a copy) of all or a portion of a control signal that conveyed the corrupted control information to the host device.

Memory device 400 may be an example of memory device 110, memory device 200, and/or memory device 310, as described with reference to FIGS. 1 through 3. Memory device 400 may include command input 403, address input 406, clock input 409, command decoder 412, command checker 415, first command line 418, second command line 421, third command line 424, fourth command line 427, command link 430, error detection latch 433, command logic 436, and address logic 439. Memory device 400 may also include register file 442, command register 445, memory state output 454, first command decoder logic 457, second command decoder logic 460, third command decoder logic 463, fourth command decoder logic 466, command output 469, and address output 472.

Command input 403 may be configured to convey commands embedded in received control signaling/information to other components in memory device 400. In some cases, a portion of a transmitted control signal representing a command is conveyed over command input 403. In some cases, a receiver at memory device 400 (e.g., memory transceiver 340) outputs a received version of the portion of the transmitted control signal representing a command over command input 403. Address input 406 may be similarly configured to convey addresses corresponding to commands embedded in control signaling/information to components in memory device 400. Together command input 403 and address input 406 may be configured to provide command and address signaling/information to components in memory device 400. In some cases, command input 403 and/or address input 406 may be further configured to convey error detection information (e.g., CRC and/or parity bits) to components in memory device 400. Clock input 409 may be configured to convey a timing signal (e.g., a clock) to components in memory device 400.

Command decoder 412 may be configured to receive command information via command input 403 and to determine a command corresponding to the received control information. For instance, command decoder 412 may determine that the received command information corresponds to an ACT, PRE, RD, or WR command after decoding the received command information.

First command line 418, second command line 421, third command line 424, and fourth command line 427 may be configured to convey commands to a memory array within memory device 400. In some cases, after identifying a command that corresponds to received control information, command decoder 412 may output the determined command over a particular command line. For instance, command decoder 412 may output an ACT command over first command line 418, a PRE command over second command line 421, a RD command over third command line 424, and a WR command over fourth command line 427.

First command decoder logic 457, second command decoder logic 460, third command decoder logic 463, and fourth command decoder logic 466 may be configured to relay or block a signal on first command line 418, second command line 421, third command line 424, and fourth command line 427 to a memory array in memory device 400. For instance, first command decoder logic 457 may be configured to block a signal on first command line 418 from being delivered to the memory array if an output of error detection latch 433 indicates that an error has been detected to first command decoder logic 547.

Command checker 415 may be configured to detect errors in received control information. In some cases, command checker 415 may determine that an error is present in received control information using error detection techniques. For instance, command checker 415 may check if CRC and/or parity bits included in the control information are consistent with the received control information. Command checker 415 may be further configured to output whether an error has been detected in received control information to other components in memory device 400. For example, command checker 415 may be configured to output a certain voltage (e.g., a high voltage) when an error is detected in received control information.

Error detection latch 433 may be configured to store an output of command checker 415. Error detection latch 433 may be further configured to signal the output of command checker to other components in memory device 400. In some cases, error detection latch 433 is coupled with clock input 409 and repeatedly stores the output of command checker 415 each time a rising edge of a signal transmitted over clock input 409 is registered at error detection latch 433. After error detection latch 433 stores the output of command checker 415, error detection latch 433 may also signal the output of command checker 415 to other components in memory device 400. In this way, error detection latch 433 may delay the signaling of an output of command checker 415 to the other component in memory device 400.

Command logic 436 may be configured to block the delivery of a timing signal transmitted over clock input 409 to other components in memory device 400 until an error is detected by command checker 415. For example, command logic 436 may be an AND gate, where a first input of the AND gate is connected to clock input 409 and a second input of the AND gate is connected to command checker 415. The AND gate may be configured to output a low voltage so long as an output of command checker 415 is a low voltage (e.g., when no error is detected) and may be configured to output a high voltage when a timing signal transmitted over clock input 409 and an output of command checker is a high voltage (e.g., when an error is detected). Address logic 439 may be similarly configured to block the delivery of the timing signal transmitted over clock input 409 to other components in memory device 400 until an error is detected by command checker 415.

Register file 442 may be configured to store a current state of a memory array included in memory device 400. In some cases, register file 442 may be configured to store, for each memory bank in the memory array, the latest row address accessed in a memory bank and a state of the memory bank (e.g., whether the memory bank is open or closed). In some cases, the contents of register file 442 may be updated based on the output of command decoder 412. For instance, register file 442 may be configured to update the latest row address accessed in a memory bank after determining that an ACT command has been output by command decoder 412. Register file 442 may be further configured to set a flag to indicate that that the memory bank identified by the ACT command is open after determining that the ACT command has been output by command decoder 412. In another example, register file 442 may be configured to reset the flag to indicate that that the memory bank is closed after determining a PRE command identifying the memory bank has been output by command decoder 412. This relationship between register file 442 and command decoder 412, first command line 418, and/or second command line may be represented by command link 430. In some cases, command link is a physical connection (e.g., a conductive trace).

Register file 442 may be further configured to signal at least a portion of the contents of register file 442 to a host device via memory state output 454—e.g., after an error is detected by command checker 415. In some cases, memory state output 454 is coupled with data transmission lines used to convey data between memory device 400 and the host device. In some examples, the contents of register file 442 are transmitted to the host device using a more reliable transmission scheme (e.g., a transmission scheme that is associated with a lower bit error rate, such as SDR) than the transmission scheme used to transmit data between memory device 400 and the host device (e.g., DDR).

Command register 445 may be configured to store a version of a control signal (e.g., all or a portion of the control signal) transmitted over command input 403 and address input 406 after an error is detected in control information embedded in the control signal. Command register may be further configured to transmit all or a portion of the stored version of the control signal to a host device after an error is detected. In some cases, command register 445 may include command latch 448 and address latch 451.

Command latch 448 may be configured to store a command signal transmitted over command input 403 when a trigger is received (e.g., when command latch 448 detects a rising edge at an enabling input). As discussed above, command logic 436 may block the input of a timing signal transmitted over clock input 409 until an error is detected at command checker 415, where the output of command logic may trigger the storage of a command signal when an error is detected at command checker 415. Address latch 451 may be similarly configured to store an address signal transmitted over address input 406 when a trigger is received.

Command latch 448 may be further configured to signal the stored command signal to a host device via command output 469 after an error is detected by command checker 415. In some cases, command output 469 is coupled with data transmission lines used to convey data between memory device 400 and the host device. In some examples, the contents of command register 445 are transmitted to the host device using a more reliable transmission scheme (e.g., a transmission scheme that is associated with a lower bit error rate, such as PAM 2) than the transmission scheme used to transmit data between memory device 400 and the host device (e.g., PAM 4). Address latch 451 may be similarly configured to signal a stored address signal to the host device via address output 472 after an error is detected by command checker 415. In some cases, memory device 400 signals a single one of the stored command signal or the address signal to the host device (e.g., to conserve energy, to reduce bandwidth, after detecting the error in a single one of the signals, or the like).

Figure 5:
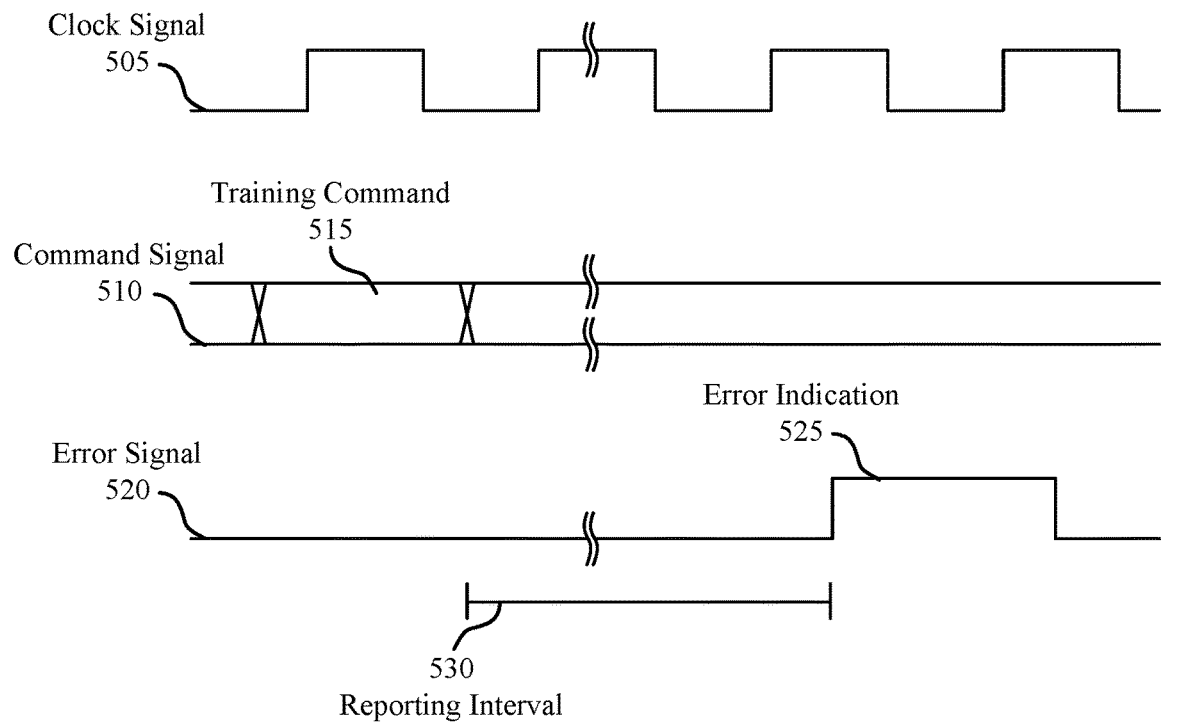
FIG. 5 illustrates an exemplary timing diagram for reporting control information errors as disclosed herein.

FIG. 5 illustrates an exemplary timing diagram for reporting control information errors as disclosed herein.

Timing diagram 500 may include clock signal 505, command signal 510, and error signal 520. The signals depicted by timing diagram 500 may represent aspects of a training procedure for determining a duration between transmitting, from a host device, a corrupted command signal and receiving, from a memory device, an error indication.

Clock signal 505 may represent one or more timing signals that is provided to components of a host device and/or a memory device, where the timing signal may be used to synchronize the timing of operations at the components. In some cases, clock signal 505 represents a voltage of clock input 409, as described with reference to FIG. 4, over time.

Command signal 510 may represent the transmission of one or more commands from a host device to a memory device. In some cases, command signal 510 represents one or more signals transmitted over command input 403 and/or address input 406, as described with reference to FIG. 4, over time. For instance, command signal 510 may represent the transmission of a signal that encompasses multiple voltages over multiple command lines, where a pattern of the combined voltages of the signal correspond to a memory command. Training command 515 may be transmitted in command signal 510. In some cases, a training command 515 may be a command including control and error detection information that is intentionally inconsistent. A host device may be configured to transmit training command 515 to determine a duration between transmitting a failed command and receiving an indication that the command was improperly received at a memory device (e.g., error indication 525). This duration may be represented by reporting interval 530. Unlike a corrupted command received at a memory device, the memory device may be configured not to enter a locked state after receiving training command 515.

Error signal 520 may represent the transmission of one or more error signals from a memory device to a host device. In some cases, error signal 520 is transmitted over a dedicated error line. In other cases, error signal 520 is transmitted over one or more data lines or control lines. Error indication 525 may be included in error signal 520. A memory device may be configured to transmit error indication 525 after determining that training command 515 and/or a corrupted command has been received from a host device. By transmitting error indication 525, the memory device may report to a host device that a command was incorrectly received at the memory device—e.g., due to transmission errors, reception errors, and/or decoding errors. When a host device receives error indication 525 after transmitting training command 515, the host device may determine reporting interval 530 as the time between transmitting training command 515 and receiving error indication 525.

In subsequent transmissions of control information, the host device may use reporting interval 530 to identify which transmitted commands correspond to which error indications. For example, a host device may receive an error indication from a memory device. The host device may then identify a command that was transmitted a duration equivalent to reporting interval 530 before the error indication was received. After identifying the command, the host device may determine that an error was detected in the command at the memory device. And after determining that an error was detected in the command, the host device may diagnose what cause the error in the command (e.g., a transmission error, a timing error, a signal lane error, a reception error, a decoding error, interference, etc.).

As suggested above, error indication 525 may be indicated to a host device in multiple different ways. For example, a memory device may transmit, to a host device, a particular voltage (e.g., high or low) over a dedicated error pin at the memory device, and the host device may determine that an error occurred based on detecting the particular voltage over a corresponding error pin at the host. In another example, the memory device may transmit, to a host device, a particular pattern of voltages over existing transmission lines (e.g., data and/or control lines) when an error is detected, and the host device may determine that an error occurred based on detecting the particular voltage patterns over the repurposed transmission lines. Similarly, in another example, the memory device may transmit a particular sequence of voltages (or a "pattern sequence") over existing transmission lines when an error is detected, and the host device may determine that an error occurred based on detecting the pattern sequence. In another example, the memory device may indicate the error to the host by transmitting data to the host device with an inverted checksum.

Figure 6:
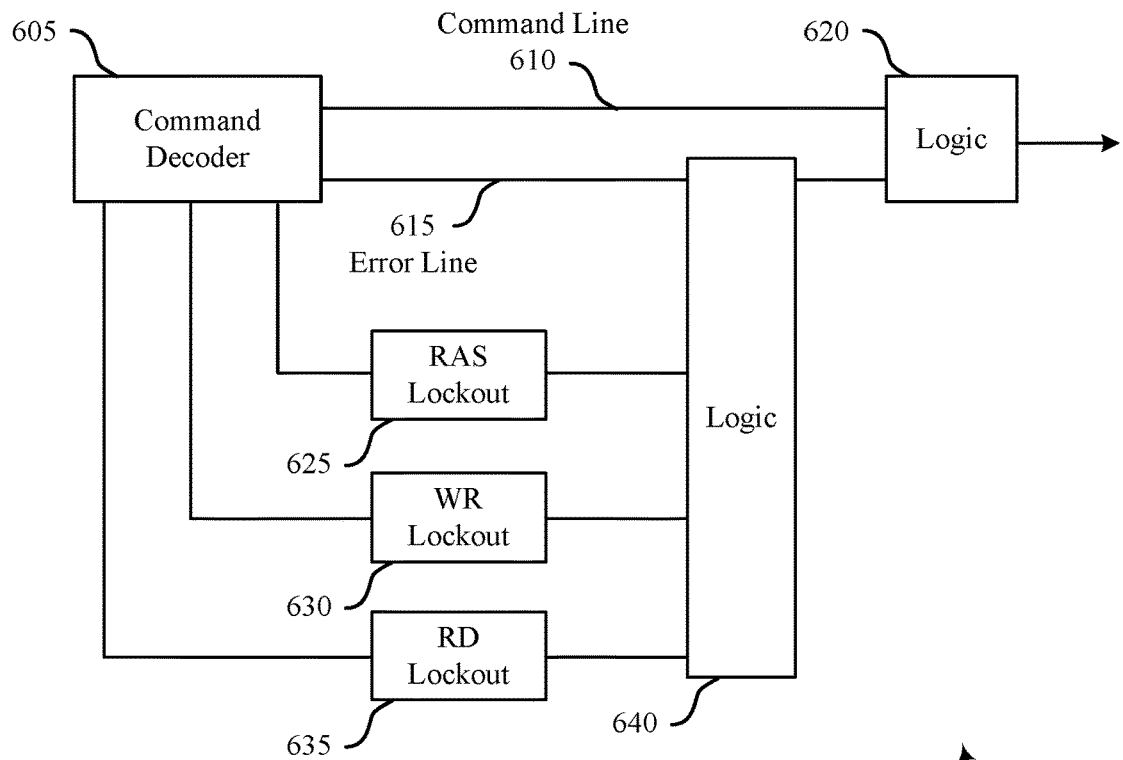
FIG. 6 illustrates aspects of an exemplary memory device that supports reporting control information errors as disclosed herein.

FIG. 6 illustrates aspects of an exemplary memory device that supports reporting control information errors as disclosed herein.

Memory device 600 may be configured to refrain from entering a locked state after an error is detected in a command until one or more lockout timers are inactive. By waiting before entering a locked state, memory device 600 may enable commands that were successfully received before the error was detected to be properly executed.

Memory device 600 may be an example of memory device 110, memory device 200, memory device 310, and/or memory device 400, as described with reference to FIGS. 1 through 4. Memory device 600 may include command decoder 605, command line 610, error line 615, first logic component 620, RAS lockout timer 625, WR lockout timer 630, RD lockout timer 635, and second logic component 640.

Command decoder 605 may be configured to decode and/or detect errors in received commands. As part of memory device 600 entering a locked state, command decoder 605 may be further configured to transmit a command that causes all of the memory banks in memory device 600 to be precharged (a "PREALL command") after an error is detected in a received command. Command decoder 605 may be an example of command decoder 412 and/or command checker 415 as described with reference to FIG. 4.

Command line 610 may be configured to convey a PREALL command to a memory array in memory device 600. In some cases, command decoder 605 may signal an indication of PREALL command over command line 610 after an error is detected in a received command. Error line 615 may be configured to convey an error indication to the memory array in memory device 600. In some cases, command decoder 605 may signal an error indication over error line 615 after an error is detected in a received command.

First logic component 620 may be configured to relay a signal transmitted over command line to the memory array when all of the inputs of first logic component 620 are activated (e.g., when command decoder 605 indicates a PREALL command over command line 610 and transmits an error indication over error line 615). First logic component 620 may also be configured to block the transmission of a signal on command line 610 when an input of first logic component 620 is not activated. In some cases, first logic component 620 includes an AND gate.

RAS lockout timer 625 may be configured to protect the operation of an ACT command by preventing memory device 600 from entering a locked state until after execution of the ACT command has completed. For example, RAS lockout timer 625 may be initiated after receiving an indication from command decoder 605 that an ACT command has been decoded by command decoder 605. After receiving the indication from command decoder 605, RAS lockout timer 625 may be configured to initiate a timer, where the timer may be active for a duration that encompasses the full execution of an ACT command up until the transmission of a subsequent, corresponding PRE command. So long as RAS lockout timer 625 is active, second logic component 640 may be configured to generate an output that causes first logic component 620 to block the relaying of a signal on command line 610 to the memory array.

WR lockout timer 630 may similarly be configured to protect the operation of a WR command by preventing memory device 600 from entering a locked state until after execution of the WR command has completed. For example, WR lockout timer 630 may be initiated after a WR command is received at command decoder 605 and may configured to be active a duration that encompasses the full execution of the WR command. So long as WR lockout timer 630 is active, second logic component 640 may be configured to generate an output that causes first logic component 620 to block the relaying of a signal on command line 610 to the memory array.

RD lockout timer 635 may similarly be configured to protect the operation of a RD command by preventing memory device 600 from entering a locked state until after execution of the RD command has completed. For example, RD lockout timer 635 may be initiated after a RD command is received at command decoder 605 and may configured to be active a duration that encompasses the full execution of the RD command. So long as RD lockout timer 635 is active, second logic component 640 may be configured to generate an output that causes first logic component 620 to block the relaying of a signal on command line 610 to the memory array.

By having multiple lockout timers corresponding to particular commands, memory device may reduce a latency associated with detecting a command error and entering a locked state. Other lockout timers may similarly be implemented at memory device 600. In some cases, instead of having individual lockout timers for different commands, memory device 600 may include a single lockout timer having that is activated for a duration that encompasses the longest execution of a memory operation.

Figure 7:
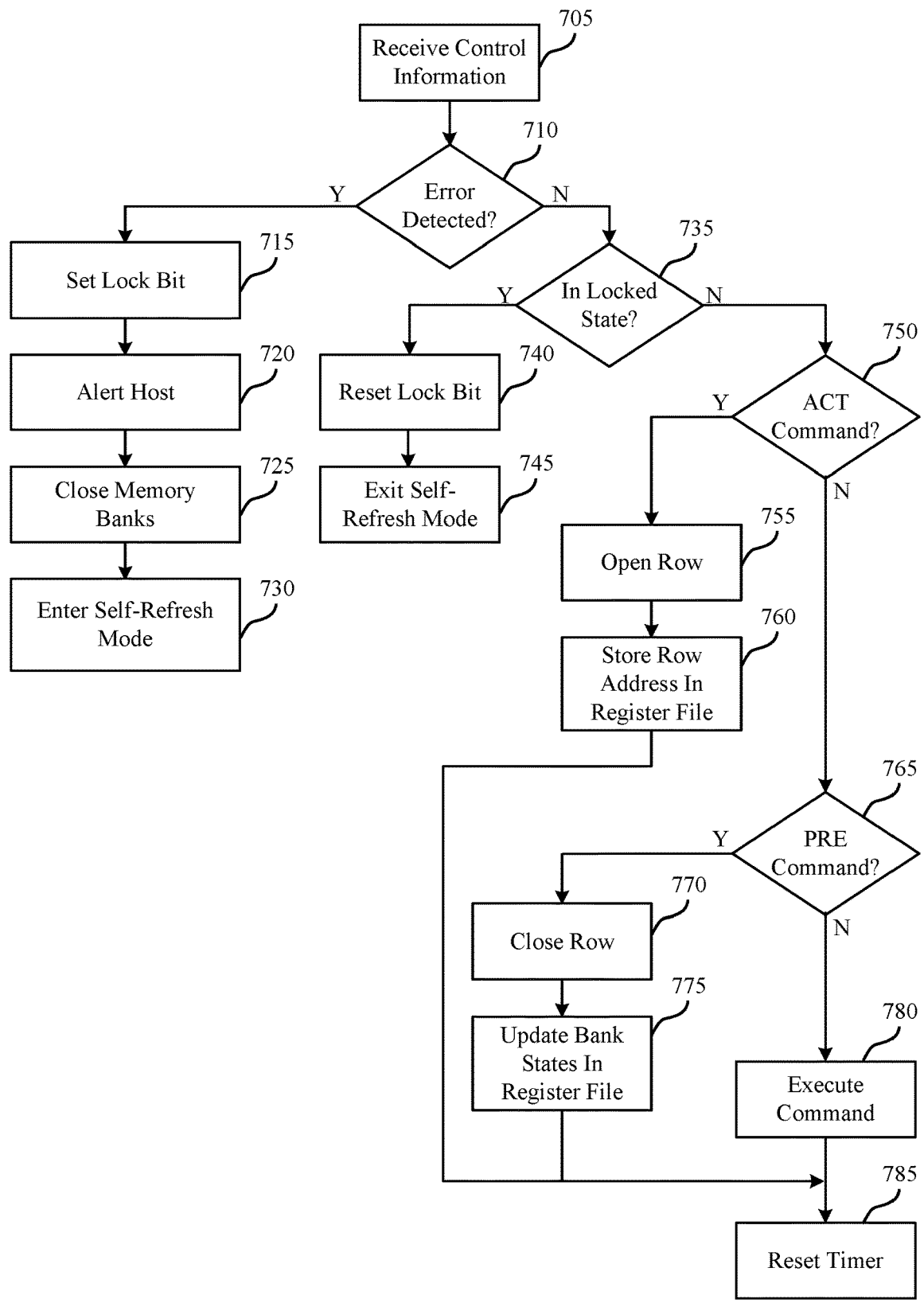
FIG. 7 illustrates an exemplary flow chart for reporting control information errors as disclosed herein.

FIG. 7 illustrates an exemplary flow chart for reporting control information errors as disclosed herein. Flow chart 700 may illustrate aspects of a method at a memory device for entering and exiting a locked state after an error is detected and reporting to a host device that an error was detected in the received control information. The memory device may be an example of memory device 200, memory device 310, memory device 400 and/or memory device 600, as described with reference to FIGS. 1 through 4 and 6. And the host device may be an example of an external memory controller 105, a processor 120, and/or a host device 305 as described with reference to FIGS. 1 and 3.

At 705, a memory device may receive control information from a host device. In some cases, memory device may receive a control signal comprising the control information at a transceiver. The control information may include commands, addresses, and/or error detection information.

At 710, after receiving the control information, the memory device may determine whether there is an error in the received control information. In some cases, the memory device determines whether there is an error using CRC bits included in the control information. For example, memory device may generate CRC bits (or a checksum) based on the control information and then may compare the generated CRC bits with the received CRC bits. If the generated and received CRC bits match, the memory device may determine that there is no error in the received control information (i.e., that the control information was successfully received, or no errors occurred during communication of the control information). Otherwise, if the generated and received CRC bits do not match, the memory device may determine that there is an error in the received control information. Similarly, the memory device may determine whether there is an error using a parity bit included in the control information. For example, memory device may determine whether the received control information has an odd or even parity based on a value of the parity bit. If the value of the parity bit indicates that the received control information has even parity and the memory device determines the received control information has even parity, the memory device may determine that there is no error in the received control information. Otherwise, if the value of the parity bit indicates that the received control information has even parity and the memory device determines the received control information has odd parity, or vice versa, the memory device may determine that there is an error in the received control information.

If an error is detected in the received control information, the memory device may perform the operations discussed at 715 through 730.

At 715, the memory device may set a lock bit that is configured to cause components at the memory device to enter a limited state. For instance, the lock bit may prevent the memory array from executing the failed command and any subsequent commands received at the memory device. In some cases, setting the lock bit includes storing a logic 1 at the lock bit. In some cases, the memory device may also store at least some of (e.g., a copy of) the received control signal that carried the corrupted control information.

At 720, the memory device may alert the host device that an error has occurred during the reception/decoding of the received control information. For instance, the memory device may transmit an indication that the error occurred over a dedicated pin or by signaling a particular pattern of voltages or sequence pattern over pins that are also used for data and/or control signaling between the memory device and the host device. In another example, the memory device may alert the host by transmitting data to the host device with an inverted checksum.

In some cases, alerting the host device may include transmitting, to the host, the state of the memory array prior to/when the error was detected in the control information. Additionally or alternatively, alerting the host device may include transmitting, to the host, all or a portion of a copy of the received control signal that conveyed the corrupted control information.

At 725, the memory device may close the memory banks located at the memory device based on detecting the error. In some cases, the memory device waits until one or more lockout timers have expired/are in a deactivated state before closing the memory banks.

At 730, the memory device may enter a self-refresh mode during which the memory banks are periodically refreshed to maintain the states stored at the memory cells in the memory banks and to avoid losing data content while the host device analyzes the failure.

If no error is detected in the received control information, the memory device may perform the operation discussed at 735.

At 735, the memory device may determine whether the memory device is currently in a locked state—e.g., based on previously identifying a command error. In some cases, the memory device may determine that the memory device is in a locked state based on identifying that a lock bit is set.

If the memory device is currently in a locked state when the error-free control information is received, the memory device may perform the operations discussed at 740 through 745

At 740, the memory device may reset the lock bit. In some cases, resetting the locked bit comprises storing a logic 0 at the lock bit. In some cases, the memory device may reset the lock bit based on determining that the received control information includes an UNLOCK command. In some cases, the memory device may reset the lock bit if an UNLOCK command is received in the control information.

At 745, the memory device may exit the self-refresh/locked mode (i.e., enter the unlocked or normal mode) based on resetting the lock bit. After returning to normal operation, the memory device may continue to process and execute control information received from the host device.

If the memory device is currently in an unlocked state when the error-free control information is received, the memory device may perform the operations discussed at 750 through 785.

At 750, the memory device may determine whether the received control information includes an ACT command. In some cases, the memory device may determine that an ACT command is received based on a command decoder at the memory device indicating that an ACT command was decoded (e.g., via a dedicated command line such as first command line 418, as described with reference to FIG. 4).

If an ACT command is received in the control information, the memory device may perform the operations discussed at 755, 760, and 785.

At 755, after determining that an ACT command was received in the control information, the memory device may open a row of memory cells in a memory bank indicated by an address received in the control information.

At 760, after opening the row of memory in the memory bank, the memory device may store the row address corresponding to the row of memory cells in a register file, such as the register file described with reference to FIG. 3, and may update a state of the memory bank as being open. In some cases, opening the row of memory cells, storing the row address, and updating the state of the memory bank, may be performed simultaneously or in a different order.

If an ACT command is not received in the control information, the memory device may perform the operations discussed at 765.

At 765, the memory device may determine whether a PRE command was received in the control information. In some cases, the memory device may determine that a PRE command is received based on a command decoder at the memory device indicating that a PRE command was decoded (e.g., via a dedicated command line such as second command line 421, as described with reference to FIG. 4).

If a PRE command is received in the control information, the memory device may perform the operations discussed at 770, 775, and 785.

At 770, after determining that a PRE command was received in the control information, the memory device may close a row of memory cells in a memory bank indicated by an address received in the control information.

At 775, after closing the row of memory cells, the memory device may update, in the register file, a state of the memory bank indicated by the address as being closed. In some cases, closing the row of memory cells and updating the state of the memory bank may be performed simultaneously or in a different order.

If a PRE command is not received in the control information, the memory device may perform the operations discussed at 780 and 785.

At 780, the memory device may determine that a command other than an ACT or PRE command is included in the error-free control information—e.g., a WR command, RD command, etc. Accordingly, the memory device may execute the received command.

At 785, the memory device may reset a lockout timer associated with the received error-free command to prevent the memory device from prematurely closing memory banks when an error is detected in subsequently received control information—e.g., as discussed with reference to FIG. 6. For example, if the memory device receives an ACT command, the memory device may reset and trigger the operation of RAS lockout timer to an initial so that the memory device will not enter a locked state until after the RAS lockout timer expires. The memory device may similarly reset and trigger the WR lockout timer, the RD lockout timer, or any other lockout timers based on receiving a corresponding command in the control information.

Figure 8:
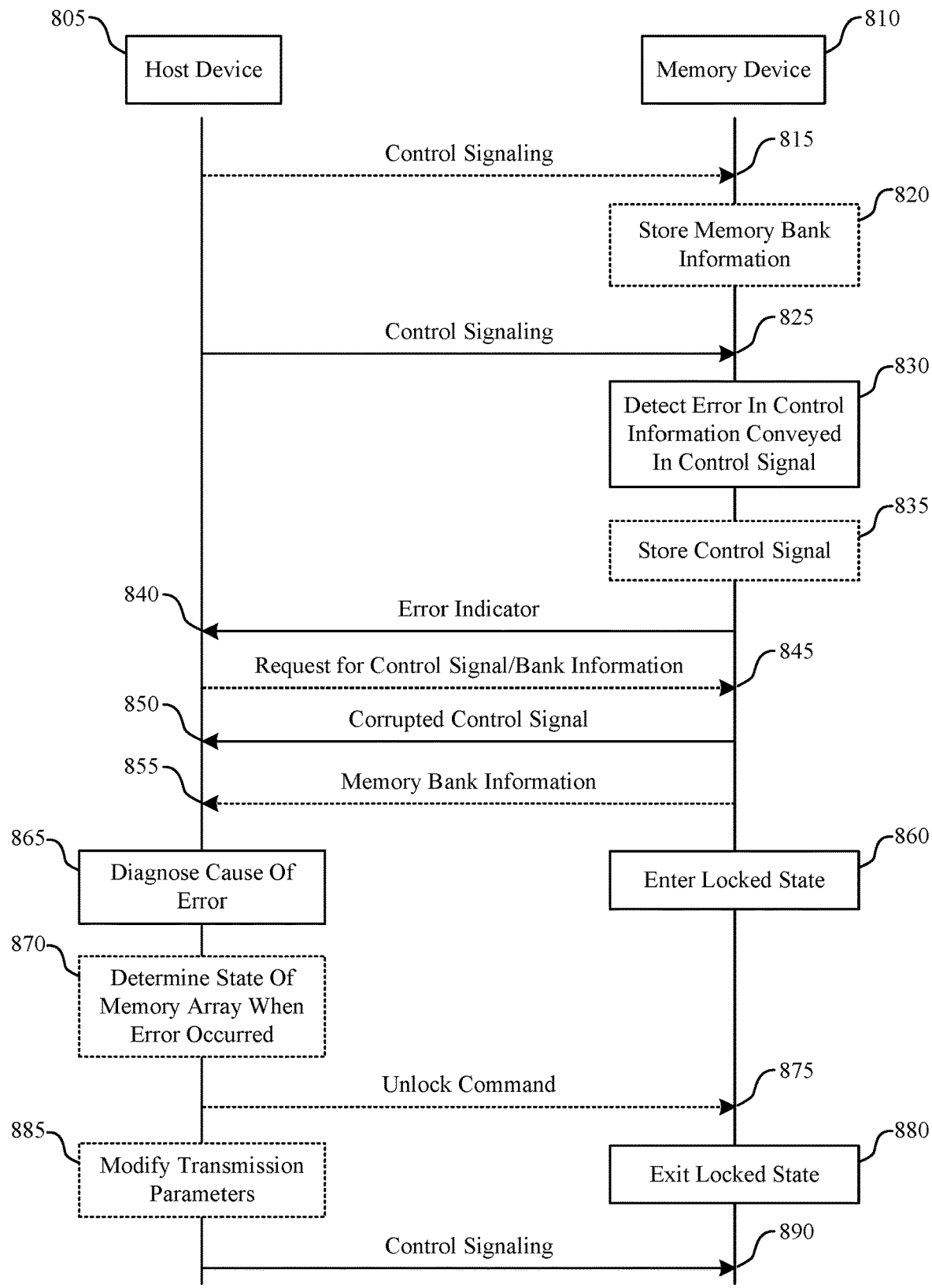
FIG. 8 illustrates an exemplary process flow for reporting control information errors as disclosed herein.

FIG. 8 illustrates an exemplary process flow for reporting control information errors as disclosed herein. Process flow 800 may be performed by host device 805 and memory device 810, which may be an example of host device 105 or 305 and memory device 110, 200, 310, or 400 as described herein with reference to FIGS. 1-4. In some examples, memory device 810 may report to host device 805 when errors occur at memory device 810 along with information (e.g., a received control signal) enabling host device 805 to diagnose what caused the error. In some examples, memory device 810 may also report a state of the memory array before/when the error occurred, enabling host device 805 to return memory array to the reported state after the error is diagnosed.

At 815, host device 805 may transmit control signaling to memory device 810, and memory device 810. The control signaling may include control information for operating a memory array at memory device 810, where control information may include commands and/or memory addresses. In some cases, the control information may also include error detection/correction information (e.g., parity and/or cyclic redundancy check (CRC) bits) that enable a receiving device to detect and/or repair errors in received control information. In some cases, before transmitting the control signaling, host device 805 may determine the control information for operating the memory array at memory device 810. For example, host device 805 may generate control information for memory device 810 in response to receiving a request to access information stored in memory from a user application.

Memory device 810 may receive and process the control signaling from host device 805. In some cases, memory device 810 may decode the control information embedded in the received control signaling to identify commands and/or memory addresses. Memory device 810 may then execute the identified commands at the identified memory address of a memory array at memory device 810—e.g., memory device may read a page of memory starting at the identified memory address. Memory device 810 may also use error detection information to perform error detection on the control information and to determine whether a received control signal was corrupted (e.g., during transmission or reception). In some cases, if an error is detected, memory device 810 may refrain from executing an identified command and may indicate to the host device that an error was received.

At 820, memory device 810 may process the control information embedded in the control signaling. Processing the control information may include storing a received memory address (e.g., a row or column address) in a register file. Processing the control information may also include storing a state of a memory bank in a memory array at memory device 810. For example, memory device 810 may receive control information including an ACT command and a row address identifying one or more memory cells in a memory bank. In some cases, a row address may correspond to a memory page. After successfully decoding the control information, memory device 810 may execute the ACT command on the one or more memory cells, opening the one or more memory cells to a corresponding digit line (e.g., by activating a corresponding word line). Additionally, memory device 810 may store the row address in a register file and may also set a flag indicating that the memory bank including the one or more memory cells is open. Memory device 810 may repeat this process for subsequent commands and memory addresses that are received. In some examples, memory device 810 stores the most recently access memory address in a memory bank and sets a flag indicating a state (e.g., open or closed) of the memory bank for each memory bank in the memory array.

In some cases, memory device 810 only stores row addresses in the register file. In some cases, memory device 810 only stores row addresses in the register file when a corresponding ACT command is received. In some examples, memory device 810 may update the state of a memory bank after receiving a PRE command for the memory bank—e.g., may set the flag to indicate that the memory bank is closed. By storing the most recent memory address accessed in a memory bank and a current state of the memory bank, memory device 810 may continuously monitor a state of the memory array—e.g., may always know which memory pages in which memory banks are opened and closed.

At 825, host device 805 may transmit control signaling to memory device 810. The control signaling may include commands, memory addresses, and/or error detection/correction information. In some cases, a control signal—including a command, memory address, and error detection/correction information—may be corrupted before or during transmission (e.g., due to interference, transmission errors, timing errors, or signal lane errors, or any combination thereof). Memory device 810 may receive and process the control signaling from host device 805. In some cases, memory device 810 incorrectly receives a control signal or receives a corrupted control signal.

At 830, after incorrectly receiving a control signal or receiving a corrupted control signal, memory device may decode the control information within the control signal and may check the control information for errors. To check the control information for errors, memory device 810 may use one or more error detection techniques. For example, memory device 810 may use CRC bits included in the control information to determine whether the command and/or memory address was correctly received—e.g., by computing a checksum from the command and memory address bits and comparing the computed checksum with the CRC bits. In another example, memory device 810 may check a parity bit included in the control information to determine whether the command and/or memory address was correctly received—e.g., by determining whether the command and/or memory address has an even or odd parity and comparing the determined parity with the received parity bit.

In some cases, memory device 810 detects an error in the received control information of the control signal based on performing the error detection. In some examples, an error detection component within memory device 810 may generate an output (e.g., a high output voltage) based on detecting the error. The error detection component may also signal the output to one or more other components within memory device 810.

At 835, after an error is detected in control information included in a received control signal (which may also be referred to as a "corrupted" or "failed" control signal), memory device 810 may store the received control signal, or a version of the received control signal, in a command register at memory device 810. In some examples, memory device 810 may store a copy of all of the received control signal (e.g., the command, address, and error detection/correction information) in the command register. In other examples, memory device 810 may store a portion of the received control signal (e.g., the command and memory portion or just the command portion) in the command register. In some cases, memory device 810 stores the received control signal in the command register based on receiving an output signal from the error detection component indicating that an error was detected in the control signal. By storing the corrupted control signal, memory device 810 may save a copy of the received control signal that may be requested and used by host device 805 to diagnose what cause the control signal to fail (e.g., interference, transmission errors, receiving errors, timing errors, and/or signal lane errors). Memory device 810 may also refrain from executing a command received in the failed control signal based on detecting the error in control information.

At 840, memory device 810 may transmit an indication to host device 805 that an error was identified while decoding control information. In some cases, the indication does not identify the error that occurred, but instead identifies that an error did occur at memory device 810. In some cases, memory device 810 transmits the indication over a dedicated pin at memory device 810 and host device receives the indication over the dedicated pin. In another example, memory device transmits the indication over pins at memory device 810 that are used for other functions, such as data or control pins. When data or control pins are used, memory device 810 may transmit a particular pattern over the pins (e.g., by applying particular voltages to one or more of the pins), and host device 805 may determine that an error occurred at memory device 810 based on receiving and identifying the particular pattern. In another example, memory device 810 may transmits the indication by transmitting a pattern sequence (e.g., a series of successive high and/or low voltages) over one or more pins, and host device 805 may determine that an error occurred at memory device 810 based on receiving and identifying the pattern sequence.

At 845, after identifying that an error occurred at memory device 810, host device 805 requests the corrupted control signal stored at memory device 810 and/or a state of the memory banks at memory device 810.

At 850, memory device 810 may transmit the corrupted control signal or a version of the corrupted control signal (e.g., a copy or portion of the received control signal) to host device 805. In some cases, after the error is detected, memory device 810 transmits all or a portion of the corrupted control signal back to host device 805 without storing the corrupted control signal and without receiving a request from host device 805—e.g., by rerouting the received signal to a transmitter at memory device 810. For example, memory device 810 may transmit the corrupted control signal back to host device 805 with the indication of the error transmitted at 840. In other cases, memory device 810 transmits the corrupted control signal stored at memory device 810 after receiving a request from host device 805 to read the corrupted control signal stored at memory device 810. Host device 805 may use the copy of (e.g., a partial or full copy) of the corrupted control signal received from memory device 810 to diagnose what originally caused the error in the corrupted control signal.

In some cases, memory device 810 may transmit the corrupted control signal to host device 805 over data transmission lines. In some cases, memory device 810 may transmit the corrupted control signal using a more reliable/robust transmission scheme than the transmission scheme use to transmit data to host device 805. For example, memory device 810 may transmit the corrupted control signal using a lower order modulation scheme (e.g., PAM2) or at a lower data rate.

At 855, memory device 810 may transmit memory bank information to host device 805. Similar to the above, memory device 810 may transmit the memory bank information with or without receiving a request from host device 805. In some cases, memory device 810 transmits the memory bank information to host device 805 with the indication of the error at 840. In other cases, memory device 810 transmits the memory bank information to host device 805 after receiving a request for the memory bank information from host device 805 at 845. Host device 805 may use the memory bank information to determine a state of a memory array at memory device 810 at a time before or when the error in the control information was identified at memory device 810.

At 860, memory device 810 may enter a locked state based on detecting an error in control information. In some cases, memory device 810 may enter a locked state based on receiving a signal from an error detection component within memory device 810. While in a locked state, memory device 810 may limit access to the memory array. For instance, memory device 810 may refrain from executing the failed command and any subsequent commands that are received at memory device 810. Memory device 810 may also close one or more (e.g., all) of the memory banks in the memory array. Memory device 810 may also precharge one or more (e.g., all) of the memory banks in the memory array. Memory device 810 may also perform self-refresh operations on the closed memory banks in the memory array.

In some cases, memory device 810 may wait before entering a locked state. For instance, memory device 810 may wait for valid memory operations that are being performed on a memory array to complete before entering all or portions of the locked state—e.g., memory device 810 may wait for a read or write operation to complete before entering the locked state. In some cases, when memory device 810 waits before entering the locked state, memory device 810 includes one or more lockout timers—e.g., memory device 810 may include a first lockout timer for ACT operations ("RAS lockout timer"), a second lockout timer for RD operations ("RD lockout timer"), and/or a third lockout timer for WR operations ("WR lockout timer"). Memory device 810 may start the RAS lockout timer when an ACT command is received. In some cases, the RAS lockout timer is a count-down timer and counts down from a value that is associated with the time between executing an ACT command and a corresponding PRE command. After the RAS lockout timer reaches zero, memory device 810 may enable memory device 810 to enter the locked state—e.g., based on the RAS lockout timer generating an output indicating that the ACT to PRE timing has expired. After the RAS lockout timer reaches zero, a value of the RAS lockout timer may be reset to the starting value and all of the memory banks in the memory array may be precharged. In some cases, analog timers may be configured as one or more of the lockout timers.

Memory device 810 may similarly start the RD and WR timers when a RD or WR command is received, where the RD lockout timer may count down from a value that is associated the time between executing an RD command and a corresponding PRE command, and the WR lockout timer may count down from a value that is associated the time between executing an WR command and a corresponding PRE command. In some cases, multiple of the RAS, RD, and WR lockout timers will be activated at one time, and memory device 810 will not enter a locked state until all of the active lockout timers reach zero.

At 865, host device 805 may diagnose the cause of the error in the control information that was unsuccessfully received by memory device 810. As suggested herein, host device 805 may use the corrupted control signal (which may be a copy of all or a portion of the actual corrupted control signal received at memory device 810) received at 850 to diagnose the cause of the error. For example, host device 805 may compare the corrupted control signal received from memory device 810 with the control signal that was actually provided to the transmitter at host device 805. Host device 805 may then identify a transmission error, a timing error, a signal lane error, a reception error, or any combination thereof. A transmission error may occur due to interference within host device 805. A timing error may occur if the timing of a transmitter at host device 805 and a receiver at memory device 810 are out-of-sync. A signal lane error may occur if there is a defect in a transmission line. A reception error may occur due to interference within memory device 810. In some cases, diagnosing the error may include retransmitting the original control information to determine if the same error results—e.g., to rule out an error caused by interference.

At 870, host device 805 may determine a state of the memory array at memory device 810 at a time before or when the error in the control information was identified. As suggested herein, host device may use the memory bank information received at 855 to identify the state of the memory array. For example, host device 805 may receive the last memory address (e.g., row address) accessed in each memory bank of the memory array, in addition to receiving a state of each memory bank (e.g., whether the memory bank was opened or closed before or at the time of the error). Host device 805 may use this information to restore the state of the memory array to the state identified before/when the error occurred. That is, host device 805 may use this information to determine which memory pages were open and closed in which memory banks when the error was identified and may direct memory device 810 to open the memory pages that were open before/when the error occurred and to close the memory pages that were closed before/when the error occurred. In some cases, host device 805 determines the state of the memory array at the time the failed command was received at memory device 810. In other cases, host device 805 determines the state of the memory array at the time the failed command was detected at memory device 810.

At 875, after the cause of the error has been diagnosed or otherwise resolved, host device 805 may transmit an unlock command to memory device 810. In some cases, the unlock command includes information for returning the memory array at memory device 810 to a previous state. In some cases, the unlock command is followed by additional commands for returning the memory array to the previous state. Memory device 810 may receive the unlock command and/or additional restoring commands and may exit the locked state.

At 880, memory device 810 may exit the locked state—e.g., based on receiving an unlock command from host device 805. Exiting the locked state may include returning memory banks of the memory to open or closed states that were identified prior to/when the error in the control information was detected. After exiting the locked state, memory device 810 may resume the processing and execution of commands received from host device 805.

At 885, host device 805 may modify transmission parameters based on diagnosing the cause of the error in the transmitted control information. Modifying transmission parameters may include refining transmission timing, using a different modulation scheme, using a different coding scheme, reducing a data rate, or any combination thereof. In some cases, host device 805 may also modify reception parameters for memory device 810, such as reception timing.

At 890, host device 805 may resume transmission of control signaling to memory device 810 according to the modified transmission parameters. In some cases, host device 805 may resend the failed control information according to the modified transmission parameters. Memory device 810 may receive the control signaling according to the modified transmission parameters and/or modified reception parameters and may execute the successfully received commands.

It should be noted that operations performed by host device 805 and memory device 810 that are discussed above may be omitted, merged, or rearranged. To name a few examples, memory device 810 may enter the locked state before transmitting the indication of the error. Memory device 810 may store a corrupted control signal after indicating that an error occurred. Or memory device 810 may transmit the indication of the error, the corrupted control signal, and/or the memory bank information in a single transmission. Other variations are possible without loss of operation.

Figure 9:
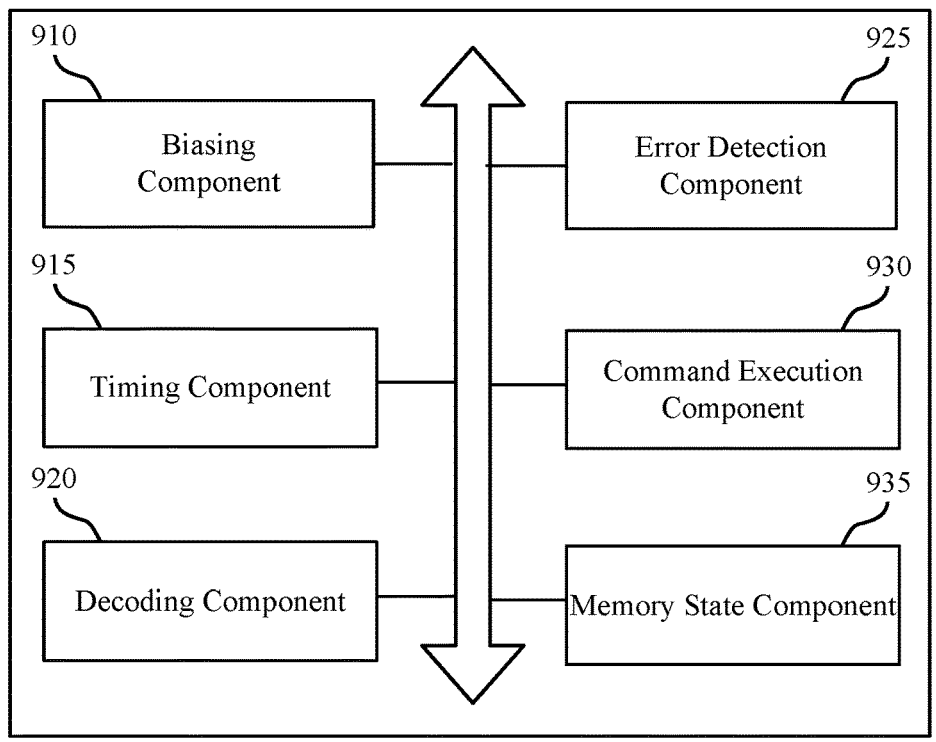
FIGS. 9 and 10 illustrate block diagrams representing aspects of controllers that support reporting control information errors as disclosed herein.

FIG. 9 illustrates a block diagram representing aspects of a controller located at a memory device that support reporting control information errors as disclosed herein.

Memory device controller 900 may be an example of a device memory controller 155, a local memory controller 165-*a*, or a local memory controller 260, as described with reference to FIGS. 1 and 2. Memory device controller 900 may include biasing component 910, timing component 915, decoding component 920, error detection component 925, command execution component 930, and memory state component 935.

In some cases, decoding component 920 may be configured to receive control information for operating a memory array in a memory device. Error detection component 925 may be configured to detect an error in the control information ("corrupted control information"). Command execution component 930 may be configured to refrain from executing a command received in the control information based on error detection component 925 detecting the error. Refraining from executing the command may include, refraining from signaling the decoded command to a memory array.

Biasing component 910 may be configured to apply voltages throughout memory device controller 900. Timing component 915 may be configured to provide a timing signal (or clock signal) to components within memory device controller 900.

Memory state component 935 may be configured to cause a memory device to enter a state that limits access to a memory array in the memory device (a "locked state") based on error detection component 925 detecting the error. Causing the memory device to enter the locked state may include signaling an error indicator to components in the memory device (e.g., by transmitting a high voltage over an error signal path that is coupled to the component in the memory device). Causing the memory device to enter the locked state may include causing decoding component 920 to refrain from executing subsequent commands and causing the memory array to close one or more memory banks and to enter a self-refresh mode. Biasing component 910, in combination with a transmitter, may be configured to transmit an indication that error detection component 925 detected an error in the received control information based on memory state component 935 causing the memory device to enter the locked state.

Memory state component 935 may be further configured to monitor a state of the memory array during normal operation (e.g., before an error is detected in received control information). After an error is detected, memory state component 935 may be configured to identify a state of the memory array (an "original state"), and in combination with biasing component and a transmitter, may be configured to transmit the identified state of the memory array to a host device. Memory state component 935 may be further configured to refrain from storing a memory address or state of a memory bank indicated in the corrupted control information.

Biasing component 910, in combination with a transmitter, may be configured to transmit the indication by applying a voltage to a dedicated pin for indicating a detection of errors in control information, by applying a pattern of voltages to a plurality of pins that indicates that an error was detected in control information, or by applying a sequence of voltages with particular timing and durations that indicate that an error was detected in control information.

Decoding component 920 may be further configured to receive one or more commands for restoring the memory array to the original state. After decoding the commands for restoring the memory array, memory state component 935 may be configured to cause the memory device to exit the locked state and command execution component 930 may be configured to restore the memory array to the original state by executing the received one or more command.

Decoding component 920 may be further configured to receive a request for the original state of the memory array, and in combination with command execution component 930 and biasing component 910, may be configured to transmit the original state of the memory array to the requesting device.

In some cases, decoding component 920 may receive and successfully decode control information from the memory array before the corrupted control information is received. Memory state component 935 may be configured to store a memory address included in the successfully decoded control information and to set a flag indicating a state of a memory bank included in the successfully decoded control information. Command execution component 930 may be configured to execute the successfully decoded control information. After the error is detected in the corrupted control information, memory state component 935 in combination with biasing component 910 and a transmitter, may be configured to transmit the memory address and flag indicating the state of the memory bank of the successfully decoded control information to a host device.

After indicating the error to the host device, decoding component 920 may be further configured to receive a command to exit the locked state (an "UNLOCK command") from the host device and memory state component 935 may be configured to cause the memory device to exit the locked state based on decoding component 920 receiving the UNLOCK command.

In some cases, after detecting an error in received control information, memory state component 935 waits for the completion of a memory operation that is in progress before signaling to components in the memory device that the error was detected in the control information.

In some cases, error detection component 925, in combination with timing component 915 and other logic components, may be configured to store all or a portion of a received control signal after detecting an error in control information included in the control signal. Error detection component 925 and biasing component 910, may be further configured to transmit the all or a portion of the stored control signal to a host device—e.g., in response to a request received from the host device. In some cases, the stored control signal is transmitted over a data channel using at a lower data rate than transmissions of data over the data channel—e.g., to increase reliability of the control signal transmission.

Figure 10:
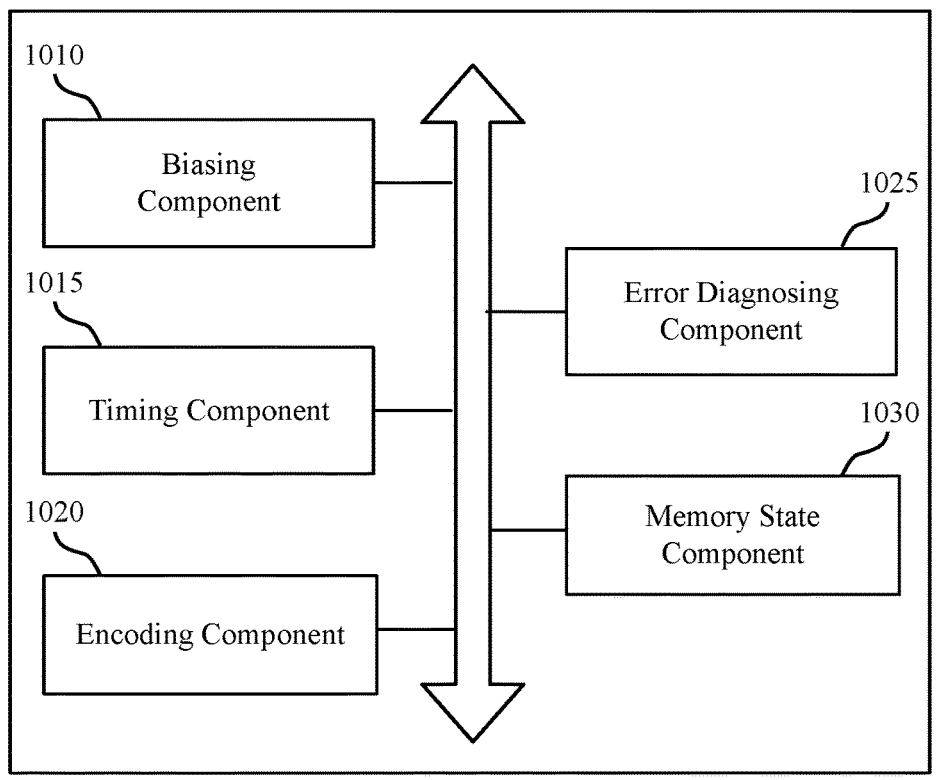

FIG. 10 illustrates a block diagram representing aspects of a controller located at a host device that support reporting control information errors as disclosed herein.

Host device controller 1000 may be an example of an external memory controller 105 as described with reference to FIG. 1. Host device controller 1000 may include biasing component 1010, timing component 1015, encoding component 1020, error diagnosing component 1025, and memory state component 1030.

Biasing component 1010 may be configured to apply voltages throughout host device controller 1000. Timing component 1015 may be configured to provide a timing signal (or clock signal) to components within host device controller 1000.

Encoding component 1020 may be configured to determine and encode control information for operating a memory array of a memory device. Encoding component 1020, in combination with biasing component 1010, may be configured to transmit a control signal comprising the control information to a host device. Error diagnosing component 1025 may be configured to receive, from the memory device, an indication that a corrupted version of the transmitted control signal was received at the memory device. Error diagnosing component 1025 may be further configured to receive a state of the memory array before the corrupted version of the control signal was received at the memory device ("original state").

Memory state component 1030, in combination with biasing component 1010, may be configured to transmit one or more commands for restoring the original state of the memory array based on receiving the original state of the memory array.

Error diagnosing component 1025 may be further configured to receive at least a portion of the corrupted version of the control signal from the memory device. Error diagnosing component 1025 may compare the control signal transmitted to the memory device with the corrupted version of the control signal and identify an error that caused the corrupted version of the control signal (e.g., a transmission, reception, interference, signal lane, or decoding error). Error diagnosing component 1025, in combination with biasing component 1010 and a transmitter, may be configured to transmit a command to the memory device directing the memory device to exit a locked state based on diagnosing the error.

Biasing component 1010 may be configured to modify a parameter for transmitting control signaling to the memory device based on error diagnosing component 1025 identifying the error. Biasing component 1010 may be further configured to perform subsequent control information using the modified transmission parameters.

In some cases, memory state component 1030 may be configured to transmit, to the memory device, a request for the original state of the memory array and may receive, for each memory bank in the memory array, the most recently accessed row of memory cells and a state of the memory bank (e.g., open or closed). In some examples, memory state component 1030 receives a row address in a memory bank and a flag indicating that the memory bank is open from the memory device. Memory state component 1030 may be further configured to determine the original state of the memory array based on the memory state information received from the memory device, and while restoring the original state of the memory array, memory state component 1030 may transmit to the memory device a command to open, in the memory bank, the row of memory cells corresponding to the row address.

Figure 11:
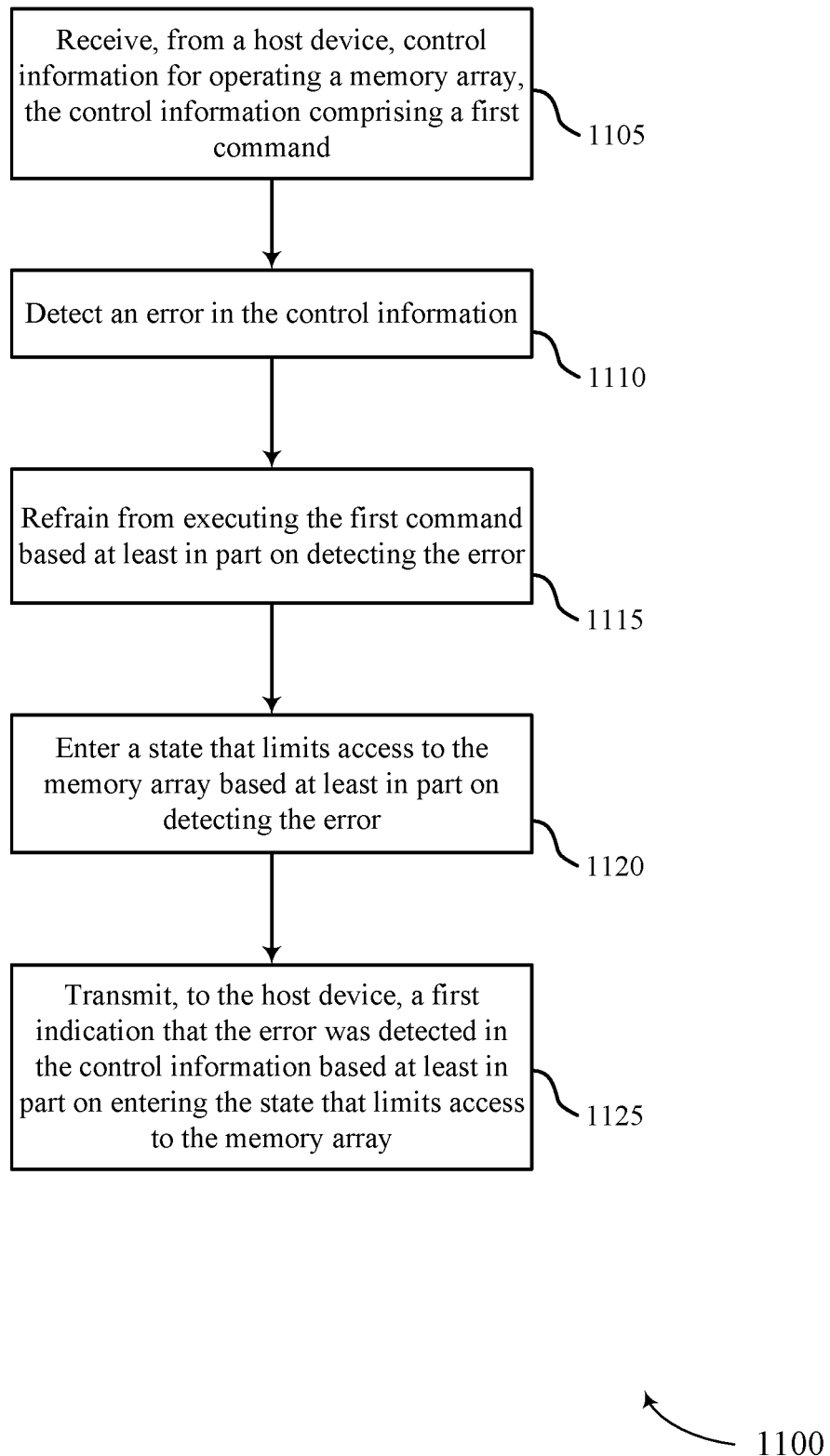
FIGS. 11 and 12 illustrate flowcharts of a method or methods for reporting control information errors as disclosed herein.

FIG. 11 illustrates a flowchart of a method or methods for reporting control information errors as disclosed herein. Method 1100 may illustrate aspects of entering, by a memory device, a locked state after an error is identified in received control information and indicating, by the memory device, that an error was identified in received control information to a host device.

At block 1105, the method may include receiving, from a host device, control information for operating a memory array, the control information comprising a first command, as described with reference to FIGS. 1 through 8. In certain examples, the operations of block 1105 may be performed or facilitated by a memory controller, as described with reference to FIGS. 1, 2, 3, and 9.

At block 1110, the method may include detecting an error in the control information, as described with reference to FIGS. 1 through 8. In certain examples, the operations of block 1110 may be performed or facilitated by a memory controller, as described with reference to FIGS. 1, 2, 3, and 9.

At block 1115, the method may include refraining from executing the first command based at least in part on detecting the error, as described with reference to FIGS. 1 through 8. In certain examples, the operations of block 1115 may be performed or facilitated by a memory controller, as described with reference to FIGS. 1, 2, 3, and 9.

At block 1120, the method may include entering a state that limits access to the memory array based at least in part on detecting the error, as described with reference to FIGS. 1 through 8. In certain examples, the operations of block 1120 may be performed or facilitated by a memory controller, as described with reference to FIGS. 1, 2, 3, and 9.

At block 1125, the method may include transmitting, to the host device, a first indication that the error was detected in the control information based at least in part on entering the state that limits access to the memory array, as described with reference to FIGS. 1 through 8. In certain examples, the operations of block 1125 may be performed or facilitated by a memory controller, as described with reference to FIGS. 1, 2, 3, and 9.

In some examples, an apparatus as described herein may perform a method or methods, such as the method 1100. The apparatus may include features, means, or instructions (e.g., a non-transitory computer-readable medium storing instructions executable by a processor) for receiving, from a host device, control information for operating a memory array, the control information comprising a first command; detecting an error in the control information; refraining from executing the first command based at least in part on detecting the error; entering a state that limits access to the memory array based at least in part on detecting the error; and transmitting, to the host device, a first indication that the error was detected in the control information based at least in part on entering the state that limits access to the memory array.

Some examples of the method, apparatuses, and non-transitory computer-readable medium described herein may further include operations, features, means, or instructions for monitoring the memory array before the error is detected; identifying a first state of the memory array based at least in part on detecting the error in the control information; and transmitting, to the host device, the first state of the memory array based at least in part on identifying the first state of the memory array.

Some examples of the method, apparatuses, and non-transitory computer-readable medium described herein may further include operations, features, means, or instructions for receiving, from the host device, one or more commands for restoring the memory array based at least in part on transmitting the first state of the memory array to the host device; exiting the state that limits access to the memory array based at least in part on the one or more commands; and restoring the memory array to the first state based at least in part on the one or more commands.

Some examples of the method, apparatuses, and non-transitory computer-readable medium described herein may further include operations, features, means, or instructions for receiving, from the host device, a request for the first state of the memory array based at least in part on transmitting the first indication, wherein the first state of the memory array is transmitted to the host device based at least in part on receiving the request.

Some examples of the method, apparatuses, and non-transitory computer-readable medium described herein may further include operations, features, means, or instructions for receiving, from the host device before the control information is received, second control information for operating the memory array, wherein the second control information comprises a second command and a second memory address that indicates a second memory bank; successfully decoding the second control information; and executing the second command based at least in part on successfully decoding the second control information. In some examples of the method, apparatuses, and non-transitory computer-readable medium described herein, monitoring the state of the memory array includes storing the second memory address based at least in part on successfully decoding the second control information; and setting a second flag based at least in part on successfully decoding the second control information, wherein the second flag indicates that the second memory bank is open.

In some examples of the method, apparatuses, and non-transitory computer-readable medium described herein, transmitting the first state of the memory array includes transmitting, to the host device, the second memory address and the second flag based at least in part on detecting the error in the control information.

In some examples of the method, apparatuses, and non-transitory computer-readable medium described herein, the control information comprises a first memory address identifying a first memory bank and monitoring the state of the memory array comprises refraining from storing the first memory address or setting a first flag indicating a state of the first memory bank based at least in part on detecting the error in the control information.

Some examples of the method, apparatuses, and non-transitory computer-readable medium described herein may further include operations, features, means, or instructions for receiving, from the host device, a second command to exit the state that limits access to the memory array; and exiting the state that limits access to the memory array based at least in part on successfully decoding the second command.

In some examples of the method, apparatuses, and non-transitory computer-readable medium described herein, entering the state that limits access to the memory array includes refraining from executing subsequent commands; closing one or more memory banks at the memory array; or performing one or more self-refresh operations on the one or more memory banks; or any combination thereof.

Some examples of the method, apparatuses, and non-transitory computer-readable medium described herein may further include operations, features, means, or instructions for waiting for a completion of a memory operation based at least in part on detecting the error in the control information; and signaling a second indication that the error was detected in the control information after the completion of the memory operation, wherein the state that limits access to the memory array is entered after the completion of the memory operation. In some examples of the method, apparatuses, and non-transitory computer-readable medium described herein, the memory operation comprises activating a first plurality of memory cells of the memory array, reading a second plurality of memory cells, or writing a third plurality of memory cells, or any combination thereof.

In some examples of the method, apparatuses, and non-transitory computer-readable medium described herein, the control information is received in a control signal and the method, apparatuses, and non-transitory computer-readable medium described herein may further include operations, features, means, or instructions for storing at least a portion of the control signal based at least in part on detecting the error in the control information; and transmitting, to the host device, at least the portion of the control signal based at least in part on entering the state that limits access to the memory array.

Some examples of the method, apparatuses, and non-transitory computer-readable medium described herein may further include operations, features, means, or instructions for receiving, from the host device, a request for at least the portion of the control signal based at least in part on transmitting the first indication that the error was detected in the control information; and transmitting, to the host device, at least the portion of the control signal based at least in part on receiving the request. In some examples of the method, apparatuses, and non-transitory computer-readable medium described herein, at least the portion of the control signal is transmitted at a lower data rate than a data rate used for transmitting data to the host device.

In some examples of the method, apparatuses, and non-transitory computer-readable medium described herein, transmitting the first indication that the error was detected includes applying a voltage to a pin for indicating a detection of errors in control information; applying a plurality of voltages to a plurality of pins for transmitting data to the host device, wherein the plurality of voltages are applied to the plurality of pins according to a pattern that indicates the detection of errors in control information; or transmitting, over at least one of the plurality of pins, a pattern sequence to the host device.

Figure 12:
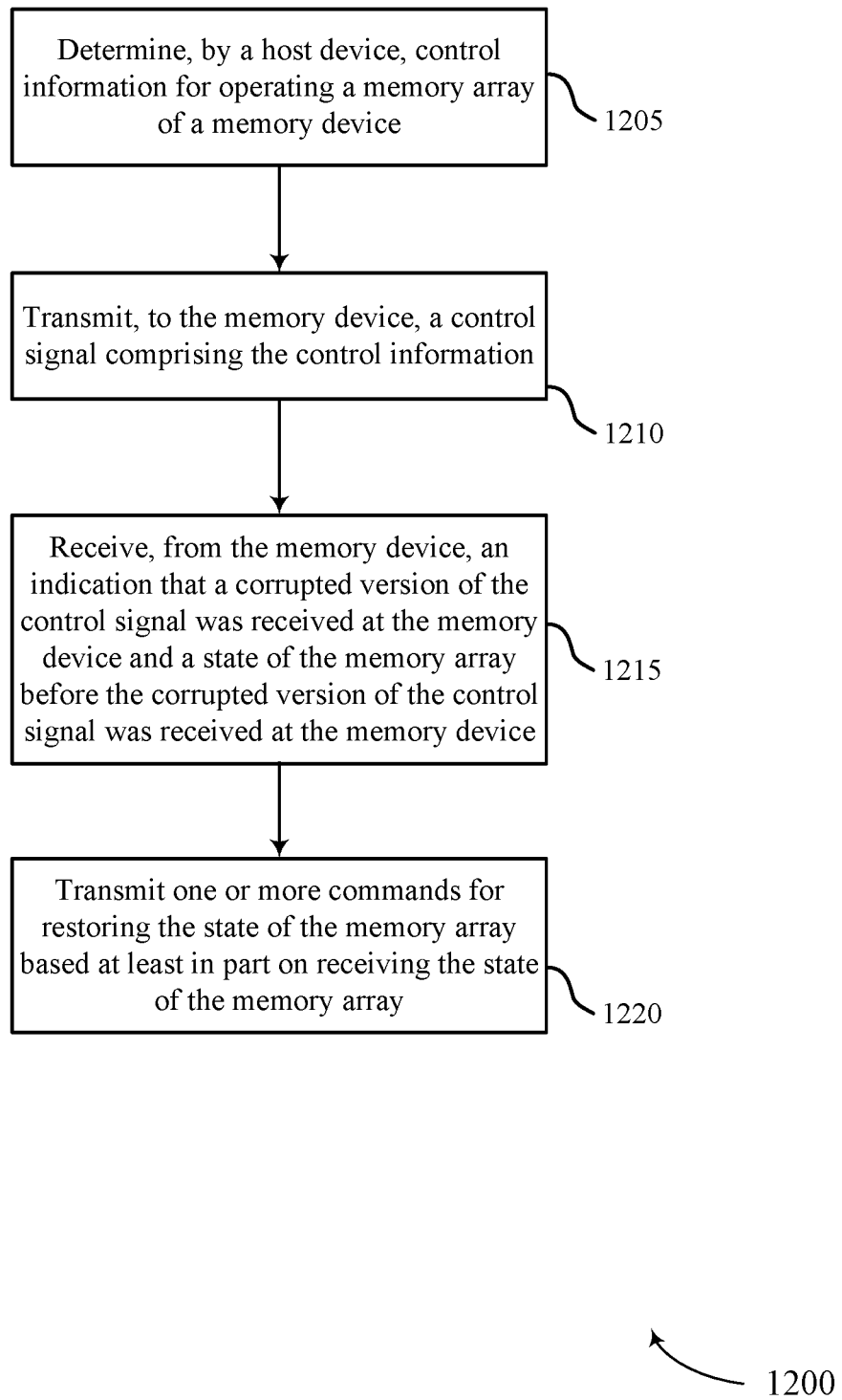

FIG. 12 illustrates a flowchart of a method or methods for reporting control information errors as disclosed herein. Method 1200 may illustrate aspects of restoring, by a host device, a current state of a memory array to a previous state that was identified before an error was identified in control information received at a memory device and determining, by the host device, a cause of an error identified in the control information transmission.

At block 1205, the method may include determining, by a host device, control information for operating a memory array of a memory device, as described with reference to FIGS. 1 through 8. In certain examples, the operations of block 1205 may be performed or facilitated by a memory controller, as described with reference to FIGS. 1, 2, 3, and 10.

At block 1210, the method may include transmitting, to the memory device, a control signal comprising the control information, as described with reference to FIGS. 1 through 8. In certain examples, the operations of block 1210 may be performed or facilitated by a memory controller, as described with reference to FIGS. 1, 2, 3, and 10.

At block 1215, the method may include receiving, from the memory device, an indication that a corrupted version of the control signal was received at the memory device and a state of the memory array before the corrupted version of the control signal was received at the memory device, as described with reference to FIGS. 1 through 8. In certain examples, the operations of block 1215 may be performed or facilitated by a memory controller, as described with reference to FIGS. 1, 2, 3, and 10.

At block 1220, the method may include transmitting one or more commands for restoring the state of the memory array based at least in part on receiving the state of the memory array, as described with reference to FIGS. 1 through 8. In certain examples, the operations of block 1220 may be performed or facilitated by a memory controller, as described with reference to FIGS. 1, 2, 3, and 10.

In some examples, an apparatus as described herein may perform a method or methods, such as the method 1200. The apparatus may include features, means, or instructions (e.g., a non-transitory computer-readable medium storing instructions executable by a processor) for determining, by a host device, control information for operating a memory array of a memory device; transmitting, to the memory device, a control signal comprising the control information; receiving, from the memory device, an indication that a corrupted version of the control signal was received at the memory device and a state of the memory array before the corrupted version of the control signal was received at the memory device; and transmitting one or more commands for restoring the state of the memory array based at least in part on receiving the state of the memory array.

Some examples of the method, apparatuses, and non-transitory computer-readable medium described herein may further include operations, features, means, or instructions for receiving, from the memory device, at least a portion of the corrupted version of the control signal; comparing the control signal transmitted to the memory device with at least the portion of the corrupted version of the control signal received from the memory device; identifying an error that caused the corrupted version of the control signal based at least in part on the comparison, wherein identifying the error comprises identifying a transmission error, a timing error, a signal lane error, or any combination thereof; and transmitting, to the memory device, a command to exit a state limiting access to the memory device based at least in part on identifying the error.

Some examples of the method, apparatuses, and non-transitory computer-readable medium described herein may further include operations, features, means, or instructions for modifying a parameter for transmitting control signaling to the memory device based at least in part on identifying the error; and transmitting, to the memory device, a second signal comprising the control information in accordance with the modified parameter for transmitting control signaling.

In some examples of the method, apparatuses, and non-transitory computer-readable medium described herein, the control information comprises a first command and a first memory address that indicates a first memory bank. Some examples of the method, apparatuses, and non-transitory computer-readable medium described herein may further include operations, features, means, or instructions for transmitting, to the memory device based at least in part on receiving the indication that the corrupted version of the control signal was received at the memory device, a request for the state of the memory array before the corrupted version of the control signal was received. In some examples of the method, apparatuses, and non-transitory computer-readable medium described herein, receiving the state of the memory array includes receiving, from the memory device, a second memory address identifying a plurality of memory cells in a second memory bank and a flag indicating that the second memory bank was open before the corrupted version of the control signal was received.

Some examples of the method, apparatuses, and non-transitory computer-readable medium described herein may further include operations, features, means, or instructions for determining the state of the memory array when the corrupted version of the control signal was received based at least in part on the second memory address and the flag. In some examples of the method, apparatuses, and non-transitory computer-readable medium described herein, transmitting the one or more commands for restoring the state of the memory array includes transmitting, to the memory device, a second command to open the plurality of memory cells in the second memory bank based at least in part on the second memory address and the flag.

It should be noted that the methods described above describe possible implementations, and that the operations and the steps may be rearranged or otherwise modified and that other implementations are possible. Furthermore, embodiments from two or more of the methods may be combined.

In some examples, an apparatus or device may perform aspects of the functions described herein using general, or special-purpose hardware. For example, an apparatus or device may include a memory array comprising a plurality of memory banks; a receiver coupled with the memory array and configured to receive control signaling comprising control information for accessing the memory array; a circuit coupled with the receiver and configured to detect errors in the control information and to signal an indication of detected errors, wherein the memory array is configured to enter a state of limited access based at least in part on an output of the circuit; a first register coupled with the circuit and configured to store a state of the memory array based at least in part on the output of the circuit; and a transmitter coupled with the first register and configured to transmit, to a host device, a content of the first register and an indication of an error detected in control information corresponding to the content of the first register.

In some examples, the apparatus or device includes a component configured to cause the memory array to enter the state of limited access based at least in part on the output of the circuit.

In some examples, the apparatus or device includes a decoder coupled with the receiver and the memory array, the decoder configured to decode received control information and to signal decoded control information to the memory array; a clock coupled with the first register and configured to provide timing signals for the apparatus; and a logic component configured to block an output of the clock based on the output of the circuit configured to detect errors, wherein an input of the logic component is coupled with the clock and the decoder and an output of the logic component is coupled with the first register.

In some examples, the apparatus or device includes a decoder coupled with the receiver and the memory array, the decoder configured to decode received control information and to signal decoded control information to the memory array; a latch configured to store the output of the circuit configured to detect errors; a clock coupled with the latch and configured to provide a timing signal, wherein the latch is further configured to signal the output of the circuit based at least in part on an output of the clock; and a logic component configured to block an output of the decoder to the memory array based at least in part on an output of the latch.

In some examples, the apparatus or device includes a second register configured to store at least a portion of a first control signal of the control signaling based at least in part on the output of the circuit configured to detect errors in the control information.

In some examples, the apparatus or device includes a decoder coupled with the first register and the memory array, the decoder configured to decode received control information and to signal decoded control information to the memory array, wherein the first register is further configured to store a memory address or a state of a memory bank, or both, based at least in part on an output of the decoder.

In some examples, the apparatus or device includes a control line coupled with the receiver and configured to carry the control signaling; a data line coupled with the transmitter and configured to carry the content of the first register; a plurality of pins coupled with the transmitter and the data line, the plurality of pins configured to signal data to an external device via the data line; and a pin coupled with the transmitter and configured to signal indications of errors detected in the control information to the external device.

In some examples, the apparatus or device includes a decoder coupled with the memory array and configured to decode the control information based at least in part on receiving the control signaling; a timer coupled with the decoder and configured to track a timing of a memory command successfully decoded by the decoder; and a logic component configured to block an output of the decoder to the memory array, wherein the logic component is configured to signal the output of the decoder based at least in part on an output of the timer.

Information and signals described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof. Some drawings may illustrate signals as a single signal; however, it will be understood by a person of ordinary skill in the art that the signal may represent a bus of signals, where the bus may have a variety of bit widths.

The terms "electronic communication," "conductive contact," "connected," and "coupled" may refer to a relationship between components that supports the flow of signals between the components. Components are considered in electronic communication with (or in conductive contact with or connected with or coupled with) one another if there is any conductive path between the components that can, at any time, support the flow of signals between the components. At any given time, the conductive path between components that are in electronic communication with each other (or in conductive contact with or connected with or coupled with) may be an open circuit or a closed circuit based on the operation of the device that includes the connected components. The conductive path between connected components may be a direct conductive path between the components or the conductive path between connected components may be an indirect conductive path that may include intermediate components, such as switches, transistors, or other components. In some cases, the flow of signals between the connected components may be interrupted for a time, for example, using one or more intermediate components such as switches or transistors.

The term "coupling" refers to condition of moving from an open-circuit relationship between components in which signals are not presently capable of being communicated between the components over a conductive path to a closed-circuit relationship between components in which signals are capable of being communicated between components over the conductive path. When a component, such as a controller, couples other components together, the component initiates a change that allows signals to flow between the other components over a conductive path that previously did not permit signals to flow.

The term "isolated" refers to a relationship between components in which signals are not presently capable of flowing between the components. Components are isolated from each other if there is an open circuit between them. For example, two components separated by a switch that is positioned between the components are isolated from each other when the switch is open. When a controller isolates two components, the controller affects a change that prevents signals from flowing between the components using a conductive path that previously permitted signals to flow.

The term "layer" used herein refers to a stratum or sheet of a geometrical structure. each layer may have three dimensions (e.g., height, width, and depth) and may cover at least a portion of a surface. For example, a layer may be a three-dimensional structure where two dimensions are greater than a third, e.g., a thin-film. Layers may include different elements, components, and/or materials. In some cases, one layer may be composed of two or more sublayers. In some of the appended figures, two dimensions of a three-dimensional layer are depicted for purposes of illustration. Those skilled in the art will, however, recognize that the layers are three-dimensional in nature.

The devices discussed herein, including a memory array, may be formed on a semiconductor substrate, such as silicon, germanium, silicon-germanium alloy, gallium arsenide, gallium nitride, etc. In some cases, the substrate is a semiconductor wafer. In other cases, the substrate may be a silicon-on-insulator (SOI) substrate, such as silicon-on-glass (SOG) or silicon-on-sapphire (SOP), or epitaxial layers of semiconductor materials on another substrate. The conductivity of the substrate, or sub-regions of the substrate, may be controlled through doping using various chemical species including, but not limited to, phosphorous, boron, or arsenic. Doping may be performed during the initial formation or growth of the substrate, by ion-implantation, or by any other doping means.

A switching component or a transistor discussed herein may represent a field-effect transistor (FET) and comprise a three terminal device including a source, drain, and gate. The terminals may be connected to other electronic elements through conductive materials, e.g., metals. The source and drain may be conductive and may comprise a heavily-doped, e.g., degenerate, semiconductor region. The source and drain may be separated by a lightly-doped semiconductor region or channel. If the channel is n-type (i.e., majority carriers are signals), then the FET may be referred to as a n-type FET. If the channel is p-type (i.e., majority carriers are holes), then the FET may be referred to as a p-type FET. The channel may be capped by an insulating gate oxide. The channel conductivity may be controlled by applying a voltage to the gate. For example, applying a positive voltage or negative voltage to an n-type FET or a p-type FET, respectively, may result in the channel becoming conductive. A transistor may be "on" or "activated" when a voltage greater than or equal to the transistor's threshold voltage is applied to the transistor gate. The transistor may be "off" or "deactivated" when a voltage less than the transistor's threshold voltage is applied to the transistor gate.

The description set forth herein, in connection with the appended drawings, describes example configurations and does not represent all the examples that may be implemented or that are within the scope of the claims. The term "exemplary" used herein means "serving as an example, instance, or illustration," and not "preferred" or "advantageous over other examples." The detailed description includes specific details to providing an understanding of the described techniques. These techniques, however, may be practiced without these specific details. In some instances, well-known structures and devices are shown in block diagram form to avoid obscuring the concepts of the described examples.

In the appended figures, similar components or features may have the same reference label. Further, various components of the same type may be distinguished by following the reference label by a dash and a second label that distinguishes among the similar components. If just the first reference label is used in the specification, the description is applicable to any one of the similar components having the same first reference label irrespective of the second reference label.

Information and signals described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

The various illustrative blocks and modules described in connection with the disclosure herein may be implemented or performed with a general-purpose processor, a DSP, an ASIC, an FPGA or other programmable logic device, discrete gate or transistor logic, discrete hardware components, or any combination thereof designed to perform the functions described herein. A general-purpose processor may be a microprocessor, but in the alternative, the processor may be any processor, controller, microcontroller, or state machine. A processor may also be implemented as a combination of computing devices (e.g., a combination of a DSP and a microprocessor, multiple microprocessors, one or more microprocessors in conjunction with a DSP core, or any other such configuration).

The functions described herein may be implemented in hardware, software executed by a processor, firmware, or any combination thereof. If implemented in software executed by a processor, the functions may be stored on or transmitted over as one or more instructions or code on a computer-readable medium. Other examples and implementations are within the scope of the disclosure and appended claims. For example, due to the nature of software, functions described above can be implemented using software executed by a processor, hardware, firmware, hardwiring, or combinations of any of these. Features implementing functions may also be physically located at various positions, including being distributed such that portions of functions are implemented at different physical locations. Also, as used herein, including in the claims, "or" as used in a list of items (for example, a list of items prefaced by a phrase such as "at least one of" or "one or more of") indicates an inclusive list such that, for example, a list of at least one of A, B, or C means A or B or C or AB or AC or BC or ABC (i.e., A and B and C). Also, as used herein, the phrase "based on" shall not be construed as a reference to a closed set of conditions. For example, an exemplary step that is described as "based on condition A" may be based on both a condition A and a condition B without departing from the scope of the present disclosure. In other words, as used herein, the phrase "based on" shall be construed in the same manner as the phrase "based at least in part on."

Computer-readable media includes both non-transitory computer storage media and communication media including any medium that facilitates transfer of a computer program from one place to another. A non-transitory storage medium may be any available medium that can be accessed by a general purpose or special purpose computer. By way of example, and not limitation, non-transitory computer-readable media can comprise RAM, ROM, electrically erasable programmable read-only memory (EEPROM), compact disk (CD) ROM or other optical disk storage, magnetic disk storage or other magnetic storage devices, or any other non-transitory medium that can be used to carry or store desired program code means in the form of instructions or data structures and that can be accessed by a general-purpose or special-purpose computer, or a general-purpose or special-purpose processor. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, digital subscriber line (DSL), or wireless technologies such as infrared, radio, and microwave are included in the definition of medium. Disk and disc, as used herein, include CD, laser disc, optical disc, digital versatile disc (DVD), floppy disk and Blu-ray disc where disks usually reproduce data magnetically, while discs reproduce data optically with lasers. Combinations of the above are also included within the scope of computer-readable media.

The description herein is provided to enable a person skilled in the art to make or use the disclosure. Various modifications to the disclosure will be apparent to those skilled in the art, and the generic principles defined herein may be applied to other variations without departing from the scope of the disclosure. Thus, the disclosure is not limited to the examples and designs described herein, but is to be accorded the broadest scope consistent with the principles and novel features disclosed herein.

What is claimed is:

1. An apparatus, comprising:
a memory array;
a decoder coupled with the memory array and configured to receive at least a first command and a second command, and configured to generate a first signal on a signal line and a second signal on a command line based at least in part on determining that the first command is decoded successfully and to generate a third signal on the signal line and a fourth signal on the command line based at least in part on determining that the second command is not decoded successfully;
a timer coupled with the decoder and configured to be activated based at least in part on receiving the first signal from the decoder; and
logic coupled with the decoder and the memory array, the logic configured to relay the second signal on the command line to the memory array for execution by the memory array based at least in part on the timer being active and to block the fourth signal on the command line from the memory array based at least in part on the timer being active.

2. The apparatus of claim 1, wherein the timer is configured to be activated for a duration based at least in part on receiving the first signal from the decoder, and wherein the second command is received at the decoder in the duration.

3. The apparatus of claim 2, wherein the logic is configured to relay the fourth signal on the command line to the memory array for execution by the memory array based at least in part on receiving the fourth signal and after the duration.

4. The apparatus of claim 1, wherein the timer comprises a first timer associated with the first command, further comprising:
a second timer coupled with the decoder via a second signal line and associated with a third command,
wherein the decoder is configured to receive the third command prior to receiving the second command and generate a fifth signal on the second signal line and a sixth signal on the command line based at least in part on determining that the third command is decoded successfully, and wherein the second timer is configured to be activated based at least in part on receiving the fifth signal from the decoder.

5. The apparatus of claim 4, wherein the logic is configured to block the fourth signal on the command line from the memory array based at least in part on the timer being active or the second timer being active.

6. The apparatus of claim 1, wherein the fourth signal comprises a command that causes precharging of the memory array based at least in part on determining that the second command is not decoded successfully.

7. A method, comprising:
receiving, at a memory system comprising a memory array, a plurality of commands for accessing the memory array, wherein the plurality of commands comprises a first command and a second command;
initiating a timer of the memory system based at least in part on receiving the first command of the plurality of commands for accessing the memory array;
detecting an error associated with the second command of the plurality of commands for accessing the memory array after initiating the timer of the memory system;
executing the first command based at least in part on detecting the error associated with the second command and the timer of the memory system being active; and
locking the memory array of the memory system based at least in part on executing the first command and the timer of the memory system expiring.

8. The method of claim 7, further comprising:
generating, by the memory system, a first signal based at least in part on detecting the error associated with the second command of the plurality of commands for accessing the memory array, wherein the first signal is configured to lock the memory array; and
generating, by the memory system, a second signal based at least in part on the timer of the memory system expiring, wherein locking the memory array of the memory system is based at least in part on generating the first signal and generating the second signal.

9. The method of claim 8, further comprising:
generating, by the memory system, a third signal based at least in part on receiving the first command, wherein initiating the timer of the memory system is based at least in part on generating the third signal.

10. The method of claim 8, wherein the memory system further comprises a logic component coupled with the memory array, the method further comprising:
receiving, by the logic component, the first signal and the second signal; and
relaying the first signal to the memory array based at least in part on receiving the first signal and the second signal, wherein locking the memory array of the memory system is based at least in part on relaying the first signal to the memory array.

11. An apparatus, comprising:
a memory array; and
a controller coupled with the memory array, wherein the controller is operable to:
receive, from a host device, control information for operating the memory array, the control information comprising a first command;
detect an error in the control information;
refrain from executing the first command based at least in part on detecting the error;
enter a state that limits access to the memory array based at least in part on detecting the error; and
transmit, to the host device, a first indication that the error was detected in the control information based at least in part on entering the state that limits access to the memory array.

12. The apparatus of claim 11, wherein the controller is operable to:
monitor the memory array before or at a time the error is detected;
identify a first state of the memory array based at least in part on detecting the error in the control information; and
transmit the first state of the memory array based at least in part on identifying the first state of the memory array.

13. The apparatus of claim 12, wherein the controller is operable to:
receive one or more commands for restoring the memory array based at least in part on transmitting the first state of the memory array;
exit the state that limits access to the memory array based at least in part on the one or more commands; and
restore the memory array to the first state based at least in part on the one or more commands.

14. The apparatus of claim 12, wherein the controller is operable to:
  receive a request for the first state of the memory array based at least in part on transmitting the first indication, wherein the first state of the memory array is transmitted based at least in part on receiving the request.

15. The apparatus of claim 12, wherein the controller is operable to:
  receive, before the control information is received, second control information for operating the memory array, wherein the second control information comprises a second command and a second memory address that indicates a second memory bank;
  decode the second control information, wherein, to monitor the state of the memory array, the controller is operable to:
    store the second memory address based at least in part on successfully decoding the second control information; and
    set a second flag based at least in part on successfully decoding the second control information, wherein the second flag indicates that the second memory bank is open; and
  execute the second command based at least in part on successfully decoding the second control information.

16. The apparatus of claim 15, wherein, to transmit the first state of the memory array, the controller is operable to:
  transmit the second memory address and the second flag based at least in part on detecting the error in the control information.

17. The apparatus of claim 12, wherein the control information comprises a first memory address identifying a first memory bank, wherein, to monitor the state of the memory array, the controller is operable to:
  refrain from storing the first memory address or setting a first flag indicating a state of the first memory bank based at least in part on detecting the error in the control information.

18. The apparatus of claim 11, wherein the controller is operable to:
  receive a second command to exit the state that limits access to the memory array; and
  exit the state that limits access to the memory array based at least in part on successfully decoding the second command.

19. The apparatus of claim 11, wherein, to enter the state that limits access to the memory array, the controller is operable to:
  refrain from executing subsequent commands;
  close one or more memory banks at the memory array; or
  perform one or more self-refresh operations on the one or more memory banks at the memory array.

20. The apparatus of claim 11, wherein the controller is operable to:
  wait for a completion of a memory operation based at least in part on detecting the error in the control information; and
  signal a second indication that the error was detected in the control information after the completion of the memory operation, wherein the state that limits access to the memory array is entered after the completion of the memory operation.

* * * * *